US012150389B2

(12) United States Patent
Beck et al.

(10) Patent No.: US 12,150,389 B2
(45) Date of Patent: Nov. 19, 2024

(54) SINGLE FLUX QUANTUM CIRCUITRY FOR QUANTIZED FLUX BIAS CONTROL

(71) Applicant: International Business Machines Corporation, Armonk, NY (US)

(72) Inventors: Matthew Beck, Danbury, CT (US); Raphael Peter Robertazzi, Ossining, NY (US); John Francis Bulzacchelli, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 18/128,447

(22) Filed: Mar. 30, 2023

(65) Prior Publication Data

US 2024/0334844 A1    Oct. 3, 2024

(51) Int. Cl.
*H10N 60/12* (2023.01)
*G06N 10/40* (2022.01)
(Continued)

(52) U.S. Cl.
CPC ............ *H10N 60/12* (2023.02); *G06N 10/40* (2022.01); *H03K 3/38* (2013.01); *H03K 19/195* (2013.01); *H10N 60/805* (2023.02)

(58) Field of Classification Search
CPC ...... H10N 60/12; H10N 60/805; G06N 10/40; H03K 19/195; H03K 3/38
(Continued)

(56) References Cited

U.S. PATENT DOCUMENTS 6,331,805 B1 *  12/2001  Gupta ................... H03B 15/00
                                                  331/107 S
9,853,645 B1    12/2017  Mukhanov et al.
(Continued)

FOREIGN PATENT DOCUMENTS

EP    2430759 B1    7/2015
EP    3577551 B1    12/2021

OTHER PUBLICATIONS

C. A. Donnelly et al., "1 GHz Waveform Synthesis With Josephson Junction Arrays," IEEE Transactions On Applied Superconductivity, Apr. 2020, 11 pages, vol. 30, No. 3.
(Continued)

*Primary Examiner* — Arnold M Kinkead
(74) *Attorney, Agent, or Firm* — Erik Johnson; Ryan, Mason & Lewis, LLP

(57) ABSTRACT

A system comprises a superconducting quantizing inductor and superconducting control circuitry, which is coupled to the superconducting quantizing inductor to form a superconducting loop, and which is configured to selectively inject a quantized amount of positive or negative current into the superconducting loop to generate a quantized circulating current in the superconducting loop. The quantized circulating current comprises a time-varying or static circulating current. The superconducting control circuitry comprises first and second current generator circuits which comprise a first and second plurality of Josephson junctions, respectively, which are configured to inject quantized amounts of positive current and negative current into the superconducting loop in response to single flux quantum pulses. The first and second current generator circuits comprise respective first and second current distribution networks that are configured to distribute circulating current in the superconduct-
(Continued)

ing loop to the respective Josephson junctions without causing switching of the Josephson junctions.

20 Claims, 14 Drawing Sheets

(51) Int. Cl.
*H03K 3/38* (2006.01)
*H03K 19/195* (2006.01)
*H10N 60/80* (2023.01)

(58) Field of Classification Search
USPC ............. 331/107 S; 326/3; 257/31; 505/853, 505/190; 327/528, 367
See application file for complete search history.

(56) References Cited

U.S. PATENT DOCUMENTS

| | | |
|---|---|---|
| 9,887,700 B2 | 2/2018 | Carmean et al. |
| 10,122,350 B2 | 11/2018 | Miller et al. |
| 11,536,780 B2 | 12/2022 | Beck |
| 2022/0065954 A1* | 3/2022 | Beck .................. G01R 33/0358 |
| 2022/0317722 A1 | 10/2022 | Nielsen et al. |
| 2022/0321072 A1 | 10/2022 | Knee et al. |

OTHER PUBLICATIONS

D.E. Kirichenko et al., "Zero Static Power Dissipation Biasing of RSFQ Circuits," IEEE Transactions on Applied Superconductivity, Authors Manuscript, Aug. 3, 2010, 4 pages.

* cited by examiner

FLUXONIUM QUBIT

SQUID

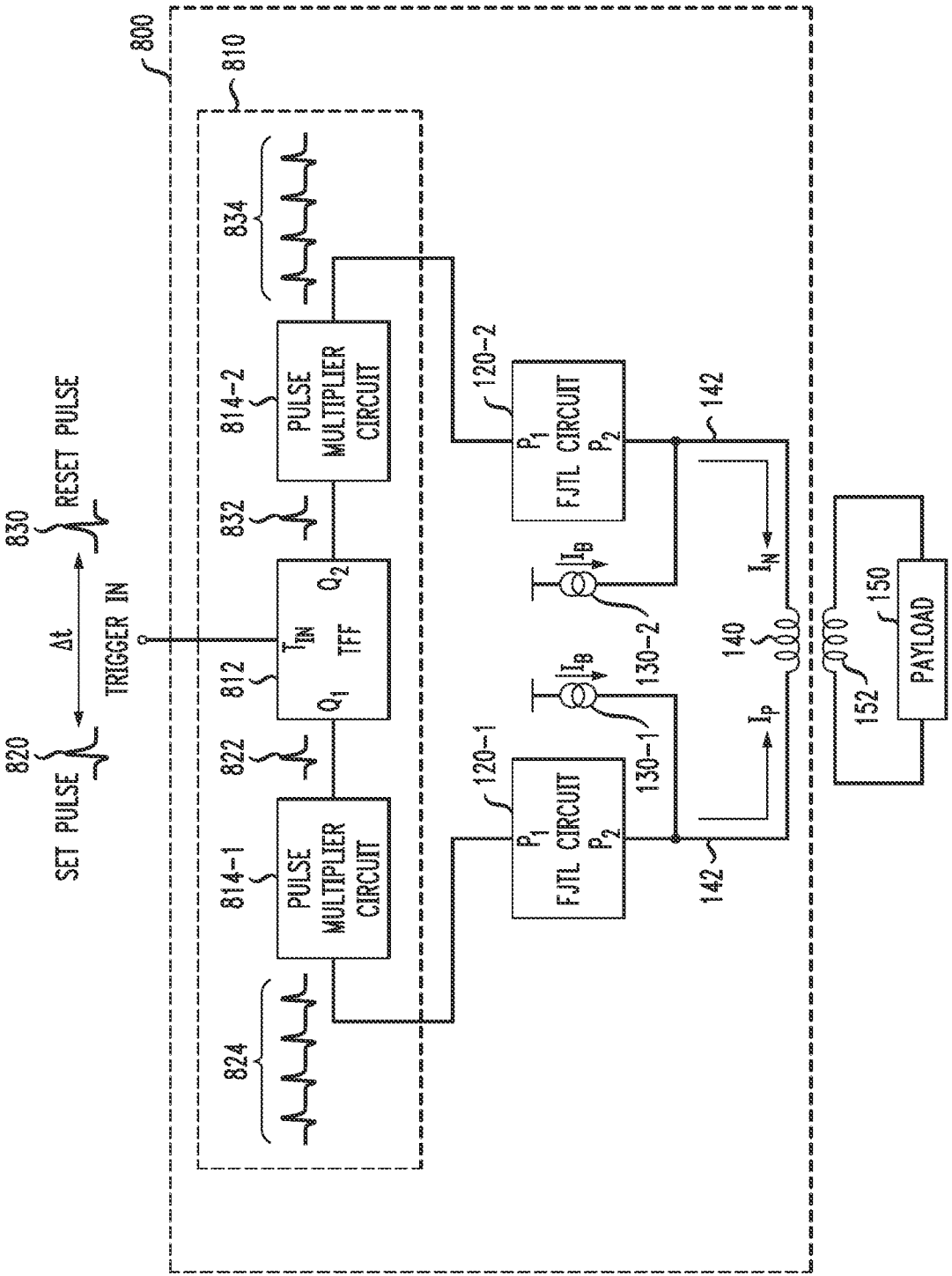

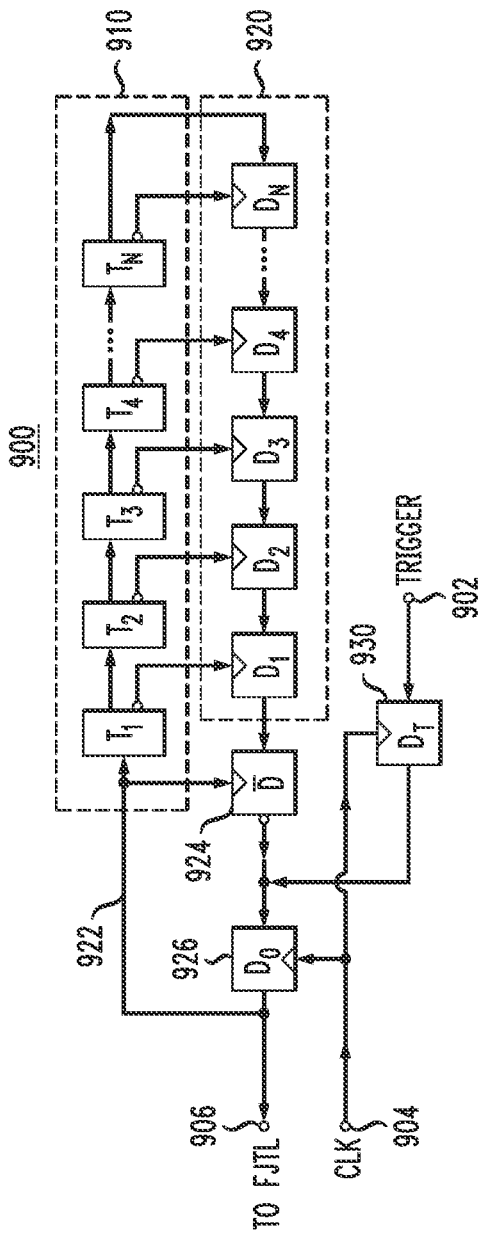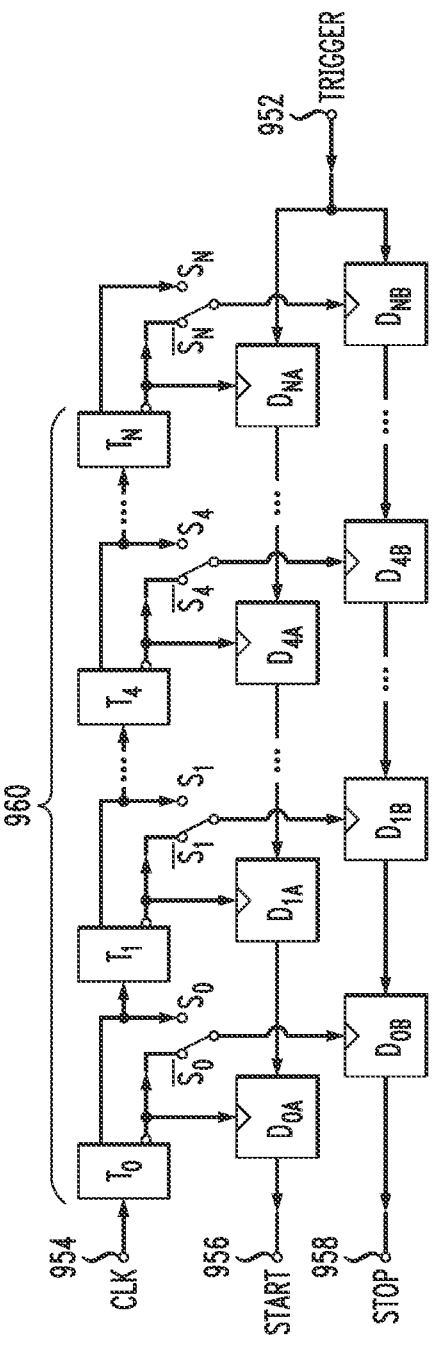
FIG. 9A
FIG. 9B

SINGLE FLUX QUANTUM CIRCUITRY FOR QUANTIZED FLUX BIAS CONTROL

BACKGROUND

This disclosure relates generally to superconducting circuitry such as superconducting single flux quantum (SFQ) circuitry for generating magnetic flux bias control signals for, e.g., quantum computing applications. In conventional systems for flux bias control, analog flux bias control signals are typically generated using an arbitrary waveform generator (AWG) system which operates in a room temperature environment, and then transmitted along control paths through a dilution refrigerator to enable flux biasing of superconducting/quantum circuitry that is disposed at the millikelvin (mK) stage of the dilution refrigerator. There are various disadvantages associated with such conventional systems for flux bias control.

For example, one disadvantage is that the analog flux bias signals must traverse through multiple temperature stages of the dilution refrigerator and through multiple attenuation stages and/or filtering stages before arriving at the target payload. In this regard, the broadband (e.g., DC—1 GHz) analog flux bias signals undergo a relatively large amount of dispersion and pulse shape distortion as such signals propagate along the control signal paths through the dilution refrigerator. Therefore, the AWG system must apply precompensation pulse shaping techniques to the analog flux bias signals to compensate for such dispersion and distortion. Another disadvantage associated with such conventional system is the stringent requirements on the amplitude stability of flux bias control pulses (requiring precise control pulse amplitudes), which is difficult to meet with control pulse generators based on semiconductor digital-to-analog converters. Moreover, fast pulse and DC offset flux biasing of superconducting quantum interference devices (SQUIDs) requires large overhead in terms of the amount of control wiring needed from a 300 K stage to a mK stage of the dilution refrigerator. Furthermore, the filtering requirements for each type of flux biasing are mutually exclusive, requiring a relatively large number of filters in the control signal paths. As such, the wiring and circuitry required to bias a plurality of quantum circuits/devices scales linearly with the number of quantum circuits/devices.

SUMMARY

Exemplary embodiments of the disclosure include systems and methods for configuring and utilizing SFQ circuitry to generate quantized magnetic flux for, e.g., flux biasing of quantum circuits.

For example, an exemplary embodiment includes a system which comprises a superconducting inductor, and superconducting control circuitry. The superconducting inductor comprises a quantizing inductance. The superconducting control circuitry is coupled to the superconducting inductor to form a superconducting loop. The superconducting control circuitry is configured to selectively inject a quantized amount of positive current or negative current into the superconducting loop to generate a quantized circulating current in the superconducting loop, wherein the quantized circulating current comprises one of a time-varying circulating current and a static circulating current. The superconducting control circuitry comprises a first current generator circuit and a second current generator circuit. The first current generator circuit comprises a first plurality of Josephson junctions and a first current distribution network, wherein the first plurality of Josephson junctions are configured to inject a quantized amount of positive current into the superconducting loop in response to each single flux quantum pulse applied to the first current generator circuit. The second current generator circuit comprises a second plurality of Josephson junctions and a second current distribution network, wherein the second plurality of Josephson junctions are configured to inject a quantized amount of negative current into the superconducting loop in response to each single flux quantum pulse applied to the second current generator circuit. The first current distribution network is configured to distribute a quantized circulating negative current in the superconducting loop to the first plurality of Josephson junctions to sink the quantized circulating negative current to a ground node through the first plurality of Josephson junctions without causing a switching of any of the first plurality of Josephson junctions. The second current distribution network is configured to distribute a quantized circulating positive current in the superconducting loop to the second plurality of Josephson junctions to sink the quantized circulating positive current to the ground node through the second plurality of Josephson junctions without causing a switching of any of the second plurality of Josephson junctions.

Advantageously, the system provides a magnetic flux bias control system that is configured to selectively inject a quantized amount of positive current or negative current into a superconducting loop to increase an amount of current or decrease an amount of current circulating in the superconducting loop to generate either a time-varying magnetic flux or a static magnetic flux, as needed, which can be inductively coupled from the superconducting inductor to a given flux-tunable superconducting circuit for flux biasing the flux-tunable superconducting circuit.

Another exemplary embodiment includes a system which comprises a quantum processor comprising a quantum circuit, and a magnetic flux bias control system. The magnetic flux bias control system comprises a superconducting inductor and superconducting control circuitry. The superconducting inductor comprises a quantizing inductance and is coupled to the quantum circuit. The superconducting control circuitry is coupled to the superconducting inductor to form a superconducting loop. The superconducting control circuitry is configured to selectively inject a quantized amount of positive current or negative current into the superconducting loop to generate a quantized circulating current in the superconducting loop to cause the superconducting inductor to generate a magnetic flux that is coupled to the quantum circuit to flux bias the quantum circuit, wherein the quantized circulating current comprises one of a time-varying circulating current and a static circulating current. The superconducting control circuitry comprises a first current generator circuit, and a second current generator circuit. The first current generator circuit comprises a first plurality of Josephson junctions and a first current distribution network, wherein the first plurality of Josephson junctions are configured to inject a quantized amount of positive current into the superconducting loop in response to each single flux quantum pulse applied to the first current generator circuit. The second current generator circuit comprises a second plurality of Josephson junctions and a second current distribution network, wherein the second plurality of Josephson junctions are configured to inject a quantized amount of negative current into the superconducting loop in response to each single flux quantum pulse applied to the second current generator circuit. The first current distribution network is configured to distribute a quantized circulating negative current in the superconducting loop to the first plurality of Josephson junctions to sink the quantized circulating negative current to a ground node through the first plurality of Josephson junctions without causing a switching of any of the first plurality of Josephson junctions. The second current distribution network is configured to distribute a quantized circulating positive current in the superconducting loop to the second plurality of Josephson junctions to sink the quantized circulating positive current to the ground node through the second plurality of Josephson junctions without causing a switching of any of the second plurality of Josephson junctions.

In another exemplary embodiment, as may be combined with the preceding paragraphs, the quantum circuit comprises an array of superconducting quantum bits comprising at least one flux-tunable superconducting quantum bit. The magnetic flux bias control system is configured to flux bias the at least one flux-tunable superconducting quantum bit.

In another exemplary embodiment, as may be combined with the preceding paragraphs, the quantum circuit comprises an array of superconducting quantum bits comprising at least one flux-tunable superconducting coupler circuit which couples at least two superconducting quantum bits. The magnetic flux bias control system is configured to flux bias the at least one flux-tunable superconducting coupler circuit to control exchange interactions between the at least two superconducting quantum bits.

Another exemplary embodiment includes a method which comprises selectively injecting a quantized amount of positive current or negative current into a superconducting loop, which comprises a first current generator circuit, a second current generator circuit, and a superconducting inductor with a quantizing inductance, to generate a quantized circulating current in the superconducting loop, wherein the quantized circulating current comprises one of a time-varying circulating current and a static circulating current, and wherein selectively injecting the quantized amount of positive current or negative current into the superconducting loop comprises: applying a single flux quantum pulse to the first current generator circuit to cause a first plurality of Josephson junctions of the first current generator circuit to inject a quantized amount of positive current into the superconducting loop; applying a single flux quantum pulse to the second current generator circuit to cause a second plurality of Josephson junctions of the second current generator circuit to inject a quantized amount of negative current into the superconducting loop; distributing a quantized circulating negative current in the superconducting loop to the first plurality of Josephson junctions to sink the quantized circulating negative current to a ground node through the first plurality of Josephson junctions without causing a switching of any of the first plurality of Josephson junctions; and distributing a quantized circulating positive current in the superconducting loop to the second plurality of Josephson junctions to sink the quantized circulating positive current to the ground node through the second plurality of Josephson junctions without causing a switching of any of the second plurality of Josephson junctions.

Other embodiments will be described in the following detailed description of exemplary embodiments, which is to be read in conjunction with the accompanying figures.

BRIEF DESCRIPTION OF THE DRAWINGS

FIGS. 6A and 6B schematically illustrate operating modes of a magnetic flux bias control system, according to an exemplary embodiment of the disclosure.

FIG. 8 schematically illustrates a magnetic flux bias control system, according to another exemplary embodiment of the disclosure.

FIG. 9A schematically illustrates an embodiment of a pulse multiplier circuit which can be implemented in the magnetic flux bias control system of FIG. 8, according to an exemplary embodiment of the disclosure.

FIG. 9B schematically illustrates a programmable delay circuit, which can be used to implement a programmable pulse multiplier circuit for the magnetic flux bias control system of FIG. 8, according to another exemplary embodiment of the disclosure.

DETAILED DESCRIPTION

Figure 1A:
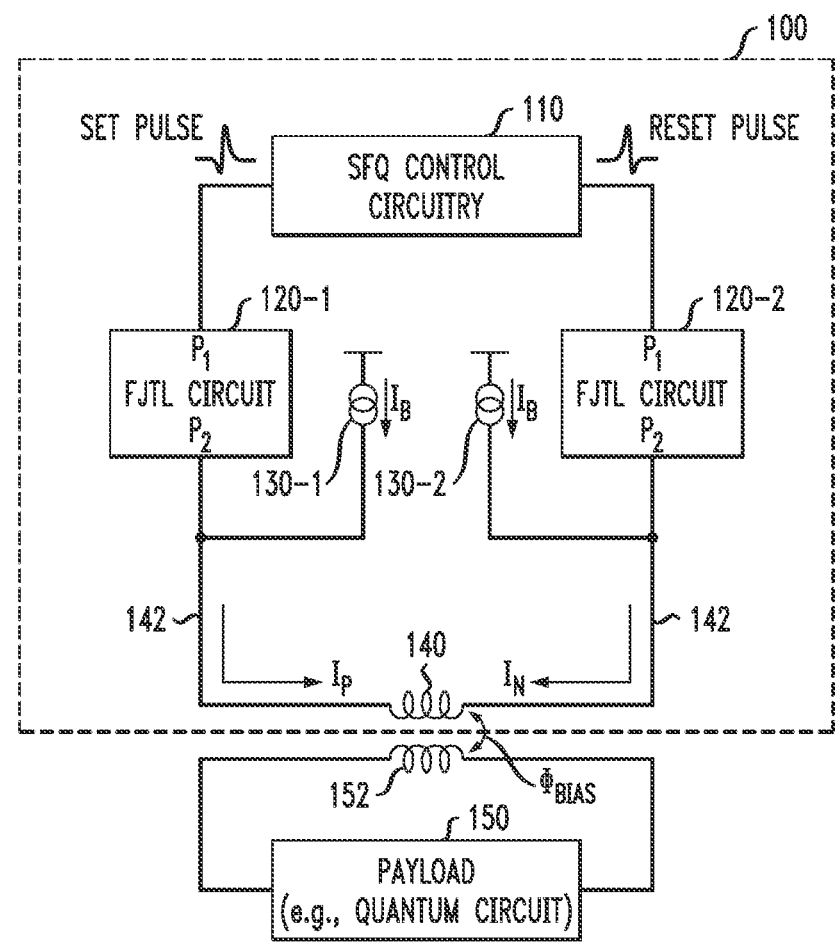
FIG. 1A schematically illustrates a magnetic flux bias control system, according to an exemplary embodiment of the disclosure.

Exemplary embodiments of the disclosure will now be described in further detail with regard to magnetic flux bias control systems and methods which are implemented using SFQ circuitry, and which are configured to generate time-varying magnetic flux bias control signals or static magnetic flux bias control signals, as needed, for flux biasing a payload circuit (e.g., a superconducting circuit or quantum circuit). The exemplary magnetic flux bias control systems as disclosed herein can be implemented using, e.g., SFQ circuit technologies including, but not limited to, rapid single flux quantum (RSFQ) or energy-efficient rapid single flux quantum (ERSFQ) circuit technologies.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise superconducting circuit elements (e.g., Josephson junctions), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as to cover embodiments when the circuit, structure, element, component, etc., is in a non-operational state (e.g., not connected nor otherwise deployed in a system, not powered on, not receiving an input, and/or not producing an output) or in a partial operational state.

FIG. 1A schematically illustrates a magnetic flux bias control system, according to an exemplary embodiment of the disclosure. In particular, FIG. 1A schematically illustrates a magnetic flux bias control system 100 which comprises SFQ control circuitry 110, a first feeding Josephson transmission line (FJTL) circuit 120-1, a second FJTL circuit 120-2, a first DC bias circuit 130-1, a second DC bias circuit 130-2, and a superconducting inductor 140 (e.g., a quantizing superconducting inductor). The magnetic flux bias control system 100 is configured to control a magnitude and polarity of magnetic flux bias (e.g., static magnetic flux or dynamic magnetic flux) which is magnetically coupled to a given payload 150 (e.g., superconducting circuit, quantum bit (qubit), qubit coupler, etc.) by the superconducting inductor 140. In some embodiments, as shown in FIG. 1A, the superconducting inductor 140 is a quantizing inductor which serves as a primary superconducting inductor which couples magnetic flux bias to the payload 150 through, e.g., a superconducting inductor 152, wherein the superconducting inductor 152 serves as a secondary superconducting inductor magnetically coupled to the superconducting inductor 140.

In general, the SFQ control circuitry 110 is configured to generate and apply SFQ pulses to the first FJTL circuit 120-1 and the second FJTL circuit 120-2. An SFQ pulse is a voltage pulse whose time integral is equal to a discrete amount of magnetic flux, i.e., a single magnetic flux quantum, referred to herein as a "fluxon." More specifically, an SFQ pulse comprises a voltage pulse having a small magnitude (e.g., 1 millivolt (mV)) and a short duration (e.g., 2 picoseconds), wherein an area of the SFQ pulse (i.e., integral of voltage over time) is equal to one magnetic flux quantum $\Phi_0$ (or one fluxon), where $\Phi_0 = h/(2e) \approx 2.07 \times 10^{-15}$ Weber (volt-seconds), where h is Planck's constant, and e denotes a magnitude of electron charge. As is known in the art, the magnetic flux quantum $\Phi_0$ is a fundamental unit of magnetic flux which represents a quantization of magnetic flux threading a superconducting loop. In this regard, an SFQ pulse is any voltage pulse having a magnitude (in millivolts) and duration (picoseconds) such that the integral of the magnitude (voltage) over the duration (time) of the SFQ pulse (i.e., quantized area of SFQ pulse) is substantially equal to $\Phi_0 = 2.07$ millivolt-picosecond (or 2.07 mA-pH), which equates to one magnetic flux quantum (or one fluxon).

In response to the SFQ pulses generated and output from the SFQ control circuitry 110, the first FJTL circuit 120-1 and the second FJTL circuit 120-2 are configured to inject quantized amounts of current in a storage loop comprising the superconducting inductor 140 to controllably adjust the magnitude and polarity of magnetic flux bias (e.g., static magnetic flux or dynamic magnetic flux) that is generated by the magnetic flux bias control system 100. More specifically, in some embodiments, the first FJTL circuit 120-1 is configured to generate and inject a quantized amount of positive current (denoted $I_P$) into the storage loop comprising the superconducting inductor 140, in response to each SFQ pulse (alternatively referred to as "Set" pulse) received from the SFQ control circuitry 110. On the other hand, the second FJTL circuit 120-2 is configured to generate and inject a quantized amount of negative current (denoted $I_N$) into the storage loop comprising the superconducting inductor 140, in response to each SFQ pulse (alternatively referred to as "Reset" pulse) received from the SFQ control circuitry 110.

In this exemplary configuration, the SFQ control circuitry 110 is configured to generate and apply sequences/patterns of SFQ pulses to the first FJTL circuit 120-1 and the second FJTL circuit 120-2 to control the amount of positive current and/or negative current that is injected into the superconducting storage loop comprising the superconducting inductor 140 and thereby adjustably control the magnitude and polarity of magnetic flux bias (DC flux bias or AC flux bias) that is generated by the current flowing in the superconductor inductor 140. The SFQ control circuitry 110 can be implemented using any suitable circuit architecture which is configured to generate and/or programmatically control the sequences/patterns of SFQ pulses that are applied to the first FJTL circuit 120-1 and the second FJTL circuit 120-2 to generate DC or AC magnetic flux bias signals with desired magnitudes and polarities. For example, in some embodiments, the SFQ control circuitry 110 may comprise an SFQ processor that is configured to execute an algorithm to generate sequences of SFQ pulses with arbitrary patterns of complexity. Exemplary embodiments for implementing the SFQ control circuitry 110 will be discussed in further detail below.

In some embodiments, the first FJTL circuit 120-1 and the second FJTL circuit 120-2 have a same circuit architecture. For example, in some embodiments, the first and second FJTL circuits 120-1 and 120-2 each comprise a non-amplifying, multistage Josephson transmission line and a balanced inductor H-tree circuit structure, an exemplary embodiment of which will be explained in detail below in conjunction with FIG. 2. As schematically illustrated in FIG. 1A, the first FJTL circuit 120-1 and the second FJTL circuit 120-2 each comprise a first port $P_1$ and a second port $P_2$. The first port $P_1$ of the first FJTL circuit 120-1 is coupled to a first output port of the SFQ control circuitry 110 and is configured to receive Set pulses. The first port $P_1$ of the second FJTL circuit 120-2 is coupled to a second output port of the SFQ control circuitry 110 and is configured to receive Reset pulses.

The second ports $P_2$ of the first and second FJTL circuits 120-1 and 120-2 are coupled to the first and second DC bias circuits 130-1 and 130-2, respectively. In some embodiments, the first and second DC bias circuits 130-1 and 130-2 are each configured to generate a static bias current $I_B$ for biasing the first and second FJTL circuits 120-1 and 120-2. While the first and second DC bias circuits 130-1 and 130-2 are generically depicted in FIG. 1A, it is to be understood that the first and second DC bias circuits 130-1 and 130-2 can be implemented using an RSFQ bias circuit or an ERSFQ bias circuit comprising a limiter Josephson junction connected in series with a large superconducting inductor, as is known in the art.

As further schematically shown in FIG. 1A, the second ports $P_2$ of the first and second FJTL circuits 120-1 and 120-2 are commonly coupled to the superconducting inductor 140 through a common flux bias line 142 that feeds quantized current (e.g., positive flux bias current $I_P$ and negative flux bias current $I_N$) to the superconducting inductor 140. As explained in further detail below, the first and second FJTL circuits 120-1 and 120-2, the common flux bias line 142, and the superconducting inductor 140 collectively form a superconducting loop for circulating flux bias current, which flows through the superconducting inductor 140 to generate a magnetic flux bias $\Phi_{BIAS}$ that is coupled to the payload 150. In some embodiments, the magnetic flux bias control system 100 generates a quantized bias current that is used to bias a given device or payload. For example, in some embodiments, the superconducting inductor 140 can be a component of a given device or payload that is biased using dynamic and/or static bias currents generated by the magnetic flux bias control system 100.

In some embodiments, the payload 150 may comprise any type of superconducting/quantum circuit or superconducting/quantum element/component of a superconducting/quantum circuit, where precisely controlled flux biasing of such circuits or components is utilized to achieve desired behaviors in, e.g., a quantum computing system. For example, in some embodiments, the payload 150 comprises a flux tunable superconducting quantum bit (qubit), such as a superconducting transmon qubit, a superconducting fluxonium qubit, a superconducting multimode, two-junction qubit (e.g., a superconducting tunable coupler qubit (TCQ)), or any other type of a superconducting qubit with a flux tunable architecture. In such embodiments, flux bias control is utilized with a flux tunable superconducting qubit to control/adjust a transition frequency (or operating frequency) of the superconducting qubit for a particular purpose. For example, flux biasing of a superconducting qubit can be utilized to precisely tune the transition frequency of the superconducting qubit to correct/compensate for manufacturing variability. In addition, flux biasing of a given superconducting qubit can be utilized to temporarily detune the transition frequency of the given superconducting qubit from a base transition frequency to a target transition frequency for the duration of the flux bias control, when executing certain quantum information processing algorithms.

Moreover, in some embodiments, the payload 150 comprises a flux tunable superconducting coupler circuit that is configured to control exchange interactions between two or more superconducting qubits to facilitate multi-qubit gate operations (e.g., two-qubit entanglement operations). More specifically, a flux tunable superconducting coupler circuit can be coupled to a pair of superconducting qubits, wherein the superconducting coupler circuit is controlled, e.g., by (i) applying a flux bias to essentially "turn on" the superconducting coupler circuit to enhance the exchange coupling (e.g., increase the ZZ exchange interaction) between the pair of superconducting qubits to perform a two-qubit gate operation (e.g., entanglement operation), and by (ii) removing the flux bias to essentially "turn off" the superconducting coupler circuit and decouple the pair of superconducting qubits to thereby eliminate or substantially suppress static ZZ interaction between the pair of superconducting qubits.

In other embodiments, the payload 150 may comprise a flux-tunable quantum-limited amplifier (QLA) such as a Josephson parametric converter (JPC), a Josephson parametric amplifier (JPA), etc. In such embodiments, the flux biasing of a given QLA can be utilized to tune the operating characteristics (e.g., operating frequency, bandwidth, etc.) of the given QLA.

Figure 1B:
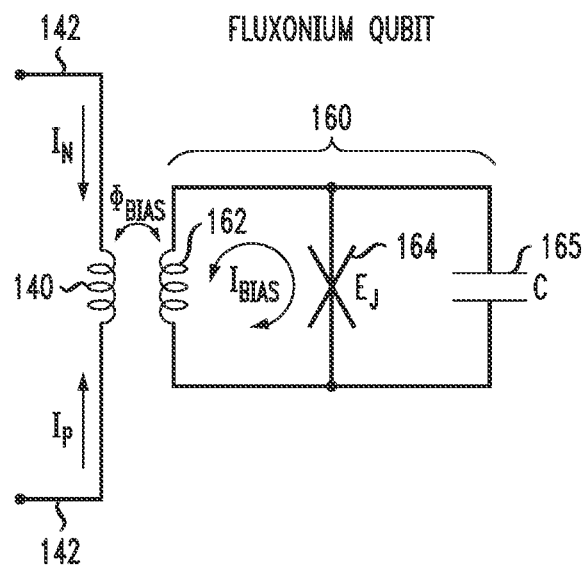
FIG. 1B schematically illustrates a quantum circuit which can be controlled through flux biasing by the magnetic flux bias control system of FIG. 1A, according to an exemplary embodiment of the disclosure.

In some embodiments, the superconducting (secondary) inductor 152 comprises an element of the payload 150. For example, FIG. 1B illustrates an exemplary embodiment where the payload 150 comprises a superconducting fluxonium qubit 160. The superconducting fluxonium qubit 160 is a type of superconducting qubit which comprises a Josephson junction 164 which is shunted by a capacitor 165 (having a relatively small capacitance) and superconducting inductor 162 which has a relatively large inductance. In some embodiments, the superconducting inductor 162 is implemented using a series array of Josephson junctions. In such instance, the superconducting inductor 162, which is mutually coupled to the superconducting inductor 140, is an element of the superconducting fluxonium qubit 160. The superconducting inductor 162 forms a superconducting loop with the Josephson junction 164 of the superconducting fluxonium qubit 160. In this instance, the superconducting (primary) inductor 140 of the magnetic flux bias control system 100 will generate a magnetic flux bias $\Phi_{BIAS}$ based on the magnitude and polarity of the flux bias current flowing through the superconducting (primary) inductor 140, wherein the magnetic flux bias $\Phi_{BIAS}$ is magnetically/inductively coupled to superconducting inductor 162 to generate a circulating bias current $I_{BIAS}$ which changes the characteristics (e.g., critical current, Josephson energy) of the Josephson junction 164 of the superconducting fluxonium qubit 160 and thus, changes the operating/transition frequency of the superconducting fluxonium qubit 160.

Figure 1C:
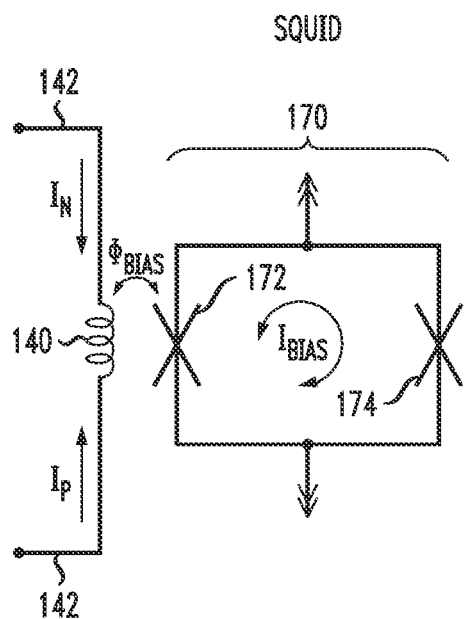
FIG. 1C schematically illustrates a quantum circuit which can be controlled through flux biasing by the magnetic flux bias control system of FIG. 1A, according to another exemplary embodiment of the disclosure.

In other embodiments, the magnetic flux bias $\Phi_{BIAS}$ that is generated by the current flowing through the superconducting inductor 140 is magnetically threaded through a superconducting loop of a quantum circuit to change the circulating current flowing in the superconducting loop and thus change the operating characteristics of the quantum circuit. For example, as schematically illustrated in FIG. 1C, some superconducting/quantum circuits and components implement a DC-SQUID 170 which comprises a first Josephson junction 172 and a second Josephson junction 174 connected in parallel to form a superconducting loop (referred to as a SQUID loop) through which the magnetic flux bias $\Phi_{BIAS}$ can be threaded to generate a circulating bias current $I_{BIAS}$ to tune the operating characteristics of the superconducting/quantum circuits and components which implement the DC-SQUID 170, as is known in the art.

The DC-SQUID 170 effectively operates as a single Josephson tunnel junction device with an effective critical current $I_{CS}$ and Josephson energy $E_{JS}$ which is tunable by applying the magnetic flux bias $\Phi_{BIAS}$ to the SQUID loop. With the exemplary circuit configuration shown in FIG. 1C, the DC-SQUID 170 of a quantum circuit (e.g., payload 150) is disposed in close proximity to the superconducting inductor 140, whereby the magnetic flux bias $\Phi_{BIAS}$ that is generated as a result of flux bias current flowing through the superconducting inductor 140 is applied to the superconducting DC-SQUID loop to generate a circulating bias current $I_{BIAS}$ which modulates the effective critical current $I_{CS}$, and thus, the Josephson energy $E_{JS}$ of the DC-SQUID 170 in a very specific manner.

Figure 1D:
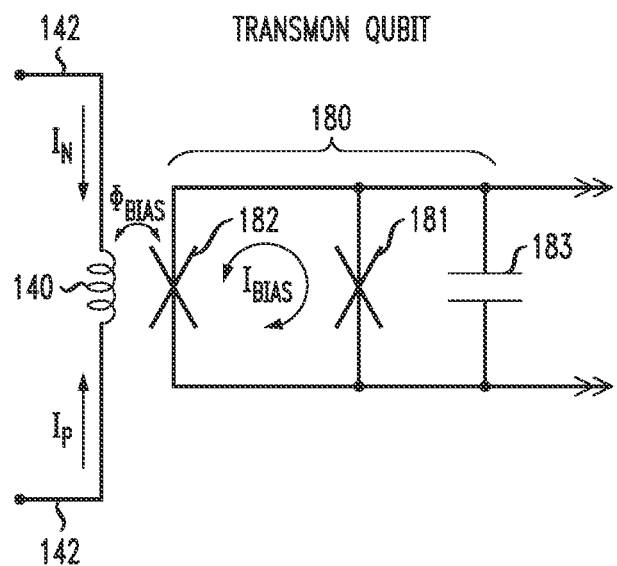
FIG. 1D schematically illustrates a quantum circuit which can be controlled through flux biasing by the magnetic flux bias control system of FIG. 1A, according to another exemplary embodiment of the disclosure.

By way of example, as schematically illustrated in FIG. 1D, a flux-tunable superconducting transmon qubit 180 can be implemented using a DC-SQUID. In general, a superconducting transmon qubit comprises a Josephson junction 181 connected in parallel with a superconducting capacitor 183. The flux-tunable superconducting transmon qubit 180 is made flux-tunable by adding a second Josephson junction 182 to implement a DC-SQUID in place of the single Josephson junction 181 of the superconducting transmon qubit to provide a superconducting SQUID loop through which a magnetic flux bias $\Phi_{BIAS}$ can be threaded to generate a circulating bias current $I_{BIAS}$ to tune the transition frequency of the flux-tunable superconducting transmon qubit 180.

Figure 1E:
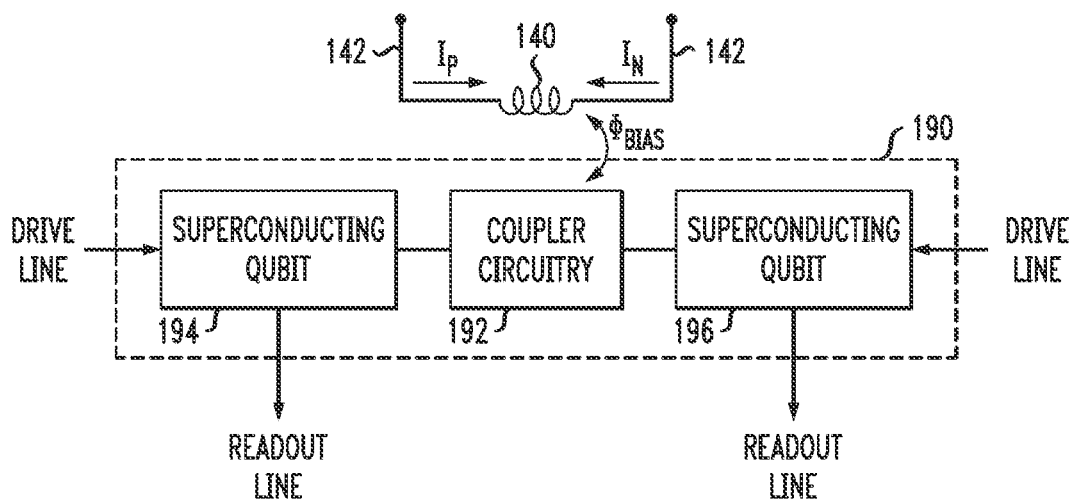
FIG. 1E schematically illustrates a quantum circuit which can be controlled through flux biasing by the magnetic flux bias control system of FIG. 1A, according to another exemplary embodiment of the disclosure.

In another exemplary embodiment, FIG. 1E illustrates a quantum circuit 190 which can be controlled through flux biasing by the magnetic flux bias control system of FIG. 1A, according to another exemplary embodiment of the disclosure. The quantum circuit 190 comprises active coupler circuitry 192 which is coupled to a first superconducting qubit 194 and a second superconducting qubit 196. The quantum circuit 190 comprises respective qubit drive lines to apply control pulses to the first and second superconducting qubits 194 and 196 to perform gate operations (e.g., single-qubit gate operations, two-qubit gate operations, etc.) and respective readout resonator lines to perform readout operations (e.g., dispersive readout operations) to read states of the first and second superconducting qubits 194 and 196.

In some embodiments, the coupler circuitry 192 is responsive to the magnetic flux bias $\Phi_{BIAS}$ (or absence thereof) control signal to operate in either a first state in which the coupler circuitry 192 is "activated" to enhance exchange interaction between the first and second superconducting qubits 194 and 196 to perform an entanglement operation, or a second state in which the coupler circuitry 192 is "deactivated" to suppress interaction (e.g., suppress static ZZ interaction) between the first and second superconducting qubits 194 and 196 during idle times (to prevent perturbance of the qubit states) or when a single-qubit gate operation is being performed on one or both of the first and second superconducting qubits 194 and 196.

Figure 2:
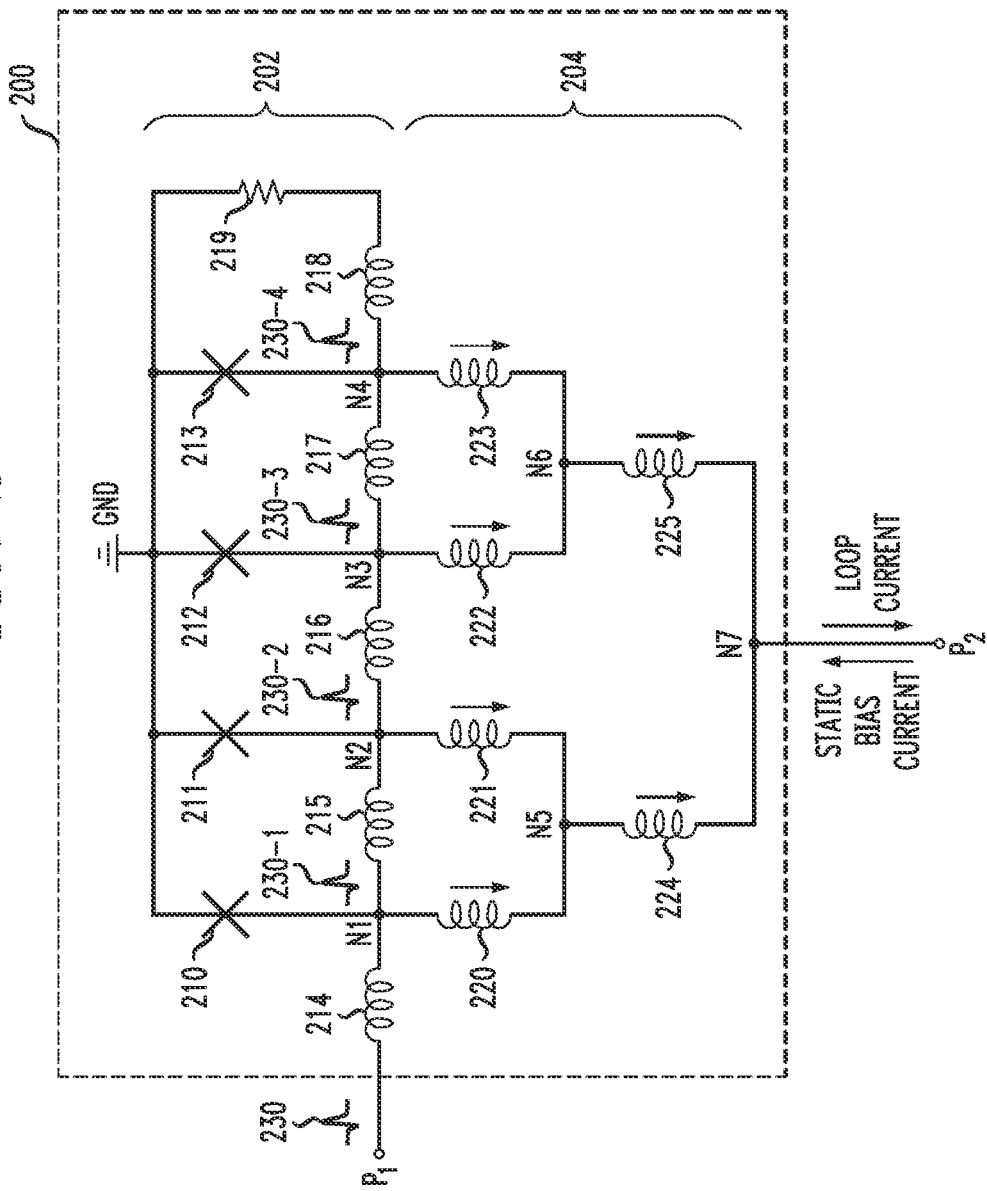
FIG. 2 schematically illustrates a superconducting feeding Josephson transmission line circuit, according to an exemplary embodiment of the disclosure.

Next, FIG. 2 schematically illustrates a feeding Josephson transmission line (FJTL) circuit, according to an exemplary embodiment of the disclosure. In some embodiments, FIG. 2 schematically illustrates an exemplary architecture of a FJTL circuit 200 to implement the first and second FJTL circuits 120-1 and 120-2 as shown in FIG. 1A. The FJTL circuit 200 comprises a first port $P_1$, a second port $P_2$, a multi-stage Josephson transmission line 202, and a balanced inductor H-tree circuit 204. The first port $P_1$ is configured to receive SFQ pulses (e.g., SFQ pulse 230) which are applied to the FJTL circuit 200. The second port $P_2$ receives a static bias current generated by a DC bias circuit (e.g., one of the first and second DC bias circuits 130-1 and 130-2 of FIG. 1A). In addition, the second port $P_2$ outputs a loop current (or flux bias current) that is sourced by the FJTL circuit 200. In addition, as explained in further detail below, the second port $P_2$ sinks a loop current that is output from another FJTL circuit.

The multi-stage Josephson transmission line 202 comprises a plurality of Josephson junctions 210, 211, 212, and 213, and a plurality of superconducting inductors 214, 215, 216, 217, and 218 (which are non-quantizing superconducting inductors), forming an exemplary 4-stage Josephson transmission line, where one end of the multi-stage Josephson transmission line 202 is terminated to the ground node GND via a resistor 219. The Josephson junctions 210, 211, 212, and 213 are coupled between a ground node GND and respective nodes N1, N2, N3, and N4. In some embodiments, the multi-stage Josephson transmission line 202 is a non-amplifying Josephson transmission line where the Josephson junctions 210, 211, 212, and 213 have the same operating characteristics, e.g., the Josephson junctions 210, 211, 212, and 213 have a same critical current $I_C$.

The balanced inductor H-tree circuit 204 comprises a current distribution network that is configured to evenly distribute bias current and circulating current. For example, the balanced inductor H-tree circuit 204 is used to bias the multi-stage Josephson transmission line 202. The balanced inductor H-tree circuit 204 comprises a plurality of superconducting inductors 220, 221, 222, 223, 224, and 225 arranged in an H-tree configuration which comprises nodes N5, N6, and N7. The node N7 (e.g., root node of H-tree) is coupled to the second port $P_2$. The superconducting inductor 224 is coupled to and between the nodes N7 and N5. The superconducting inductor 225 is coupled to and between the nodes N7 and N6. The superconducting inductor 220 is coupled to and between nodes N5 and N1. The superconducting inductor 221 is coupled to and between nodes N5 and N2. The superconducting inductor 222 is coupled to and between nodes N6 and N3. The superconducting inductor 223 is coupled to and between nodes N6 and N4.

The superconducting inductors 220, 221, 222, 223, 224, and 225 have inductances that are selected to cause the static bias current, which is input to the second port $P_2$, to be divided and equally distributed to each of the Josephson junctions 210, 211, 212, and 213 so that each Josephson junction 210, 211, 212, and 213 is biased with the same, or substantially the same, bias current. In particular, with the exemplary balanced inductor H-tree circuit 204 shown in FIG. 2, the static bias current (input to the second port $P_2$) is equally split at node N7 where about one-half (½) of the input static bias current flows to each of the nodes N5 and N6. The bias currents at nodes N5 and N6 are then equally split again, such that each Josephson junction 210, 211, 212, and 213 receives about one-quarter (¼) of the static bias current that is input to the second port $P_2$. Furthermore, when second port $P_2$ of the FJTL circuit 200 sinks loop current (flux bias current) that is sourced from another FJTL circuit, the balanced inductor H-tree circuit 204 will evenly divide and distribute the loop current (which is input to the second port $P_2$) to each Josephson junction 210, 211, 212, and 213. With this circuit configuration, the Josephson junctions 210, 211, 212, and 213 can absorb and shunt the equally divided loop current to the ground node GND without causing the Josephson junctions 210, 211, 212, and 213 to switch as a result of too high a current flowing through a Josephson junction (i.e., above the critical current of the Josephson junction). Without the balanced inductor H-tree circuit 204, the loop current may not be evenly divided, and a Josephson junction that receives more than its share of the loop current may undesirably switch.

FIG. 2 schematically illustrates an exemplary mode of operation of the FJTL circuit 200 in response to an SFQ pulse 230 (e.g., single fluxon) that is applied to the first port $P_1$. The input SFQ pulse 230 applied to the first port $P_1$ causes the switching, in succession, of the Josephson junctions 210, 211, 212, and 213, which causes some flux bias current to be injected into the balanced inductor H-tree circuit 204 each time one of the Josephson junctions 210, 211, 212, and 213 switches. As is known in the art, a Josephson junction will switch to a resistive state when the current flow through the Josephson junction exceeds the critical current $I_C$ of the Josephson junction. The critical current $I_C$ of a Josephson junction denotes a maximum amount of current that can coherently flow through the Josephson junction, while exhibiting no resistive dissipation, wherein the Josephson junction operates as a nonlinear superconducting inductor when the amount of superconducting current flowing through the Josephson junction is less than the critical current $I_C$. However, when the current flow through the Josephson junction exceeds its critical current $I_C$, the Josephson junction temporarily transitions to a resistive state, which causes a finite voltage to develop across the Josephson junction.

In the context of the exemplary FJTL circuit 200 shown in FIG. 2, the input SFQ pulse 230 applied to the first port $P_1$ generates a circulating current which causes the Josephson junction 210 to be temporarily driven above its critical current which, in turn, causes the Josephson junction 210 to switch and generate an SFQ pulse 230-1 at the node N1. The SFQ pulse 230-1 at the node N1 causes some flux bias current to be injected from node N1 into the balanced inductor H-tree circuit 204. The SFQ pulse 230-1 at node N1 generates a circulating current which causes the Josephson junction 211 to be temporarily driven above its critical current which, in turn, causes the Josephson junction 211 to switch and generate an SFQ pulse 230-2 at the node N2. The SFQ pulse 230-2 generated at the node N2 causes some flux bias current to be injected from node N2 into the balanced inductor H-tree circuit 204. The SFQ pulse 230-2 at node N2 generates a circulating current which causes the Josephson junction 212 to be temporarily driven above its critical current which, in turn, causes the Josephson junction 212 to switch and generate an SFQ pulse 230-3 at the node N3. The SFQ pulse 230-3 generated at the node N3 causes some flux bias current to be injected from node N3 into the balanced inductor H-tree circuit 204. The SFQ pulse 230-3 at the node N3 generates a circulating current which causes the Josephson junction 213 to be temporarily driven above its critical current which, in turn, causes the Josephson junction 213 to switch and generate an SFQ pulse 230-4 at the node N4. The SFQ pulse 230-4 generated at the node N4 causes some flux bias current to be injected from node N4 into the balanced inductor H-tree circuit 204.

As noted above, the superconducting inductors 214, 215, 216, 217, and 218 of the multi-stage Josephson transmission line 202 are designed to have relatively low inductance values such that the superconducting inductors 214, 215, 216, 217, and 218 are non-quantizing inductors to ensure that (i) no magnetic flux quanta can be stored/trapped between the JTL stages and that (ii) the input SFQ pulse 230 results in a relatively high magnitude circulating current to cause the successive switching of the Josephson junctions 210, 211, 212, and 213. Therefore, in the exemplary embodiment of FIG. 2, the multi-stage Josephson transmission line 202 essentially operates as an SFQ pulse repeater, wherein the input SFQ pulse 230 is actively regenerated at each of the nodes N1, N2, N3, and N4 in succession after a short propagation delay.

As schematically illustrated in FIG. 2, the flux bias currents (schematically represented by arrows) that are injected from the nodes N1 and N2 into the balanced inductor H-tree circuit 204 are combined at node N5 and flow through the superconducting inductor 224. Similarly, the flux bias currents (schematically represented by arrows) that are injected from the nodes N3 and N4 into the balanced inductor H-tree circuit 204 are combined at the node N6 and flow through the superconducting inductor 225. The flux bias currents flowing through the superconducting inductors 224 and 225 are combined at the node N7 and provide the total flux bias current (loop current) which results from, e.g., the SFQ pulse 230, and which circulates in the superconducting loop through the superconducting (primary) inductor 140 (FIG. 1A).

Figure 3:
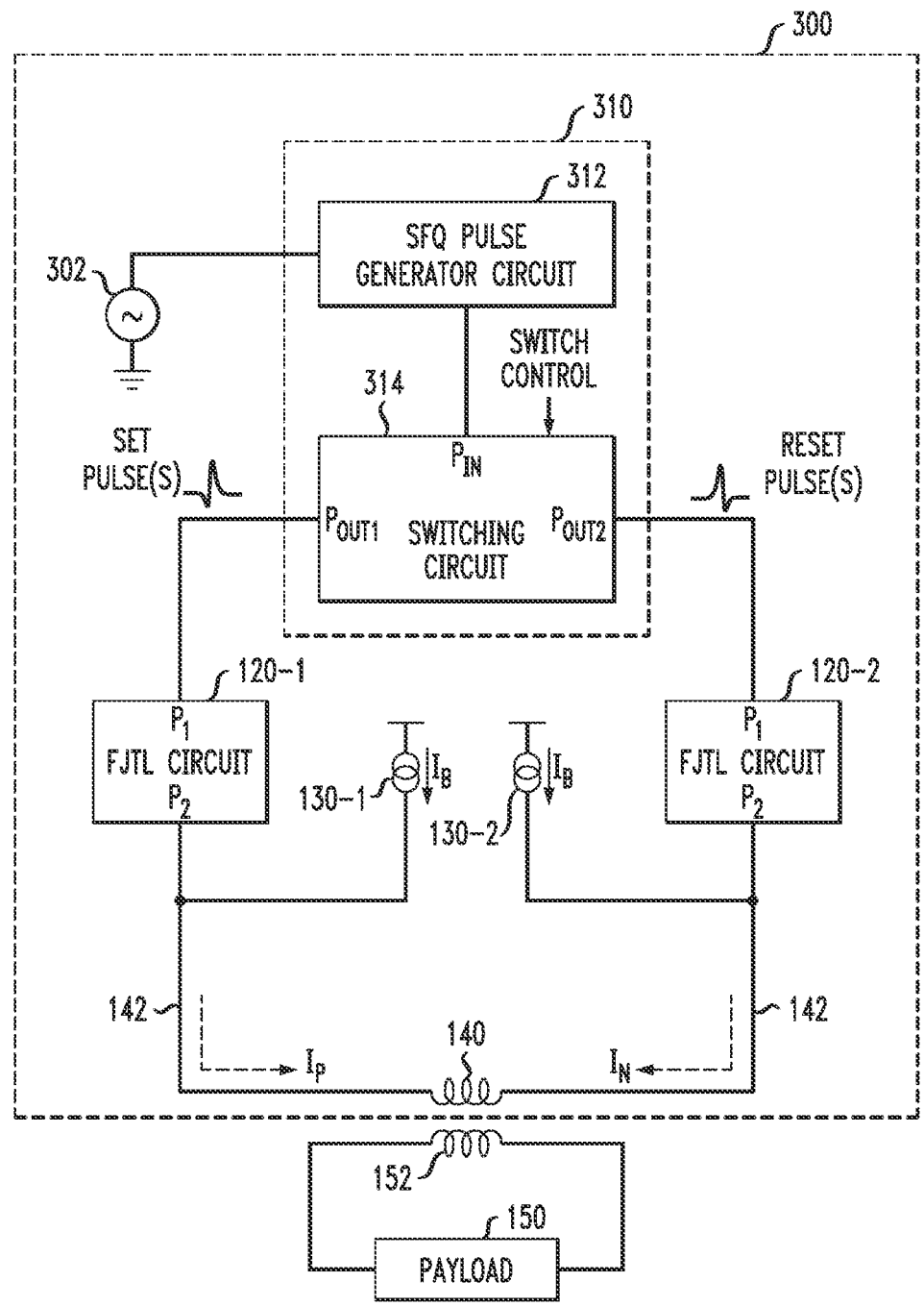
FIG. 3 schematically illustrates a magnetic flux bias control system, according to another exemplary embodiment of the disclosure.

FIG. 3 schematically illustrates a magnetic flux bias control system, according to another exemplary embodiment of the disclosure. In particular, FIG. 3 schematically illustrates a magnetic flux bias control system 300 which is similar to the magnetic flux bias control system 100 of FIG. 1A, except that the magnetic flux bias control system 300 comprises a radio frequency (RF) signal generator 302, and SFQ control circuitry 310 which comprises an SFQ pulse generator circuit 312 and a switching circuit 314. The SFQ control circuitry 310 in FIG. 3 illustrates an exemplary embodiment of the SFQ control circuitry 110 of FIG. 1A.

The RF signal generator 302 is configured to generate an RF signal at a desired frequency (e.g., 5 GHz). The SFQ pulse generator circuit 312 receives the RF signal output from the RF signal generator 302 and generates a single SFQ pulse for each cycle of the RF signal. For example, in response to an input RF signal having a frequency of 5 GHz, the SFQ pulse generator circuit 312 will generate a single SFQ pulse every 200 picoseconds. An exemplary embodiment of the SFQ pulse generator circuit 312 will be discussed below in conjunction with FIG. 4. In some embodiments, the RF signal generator 302 is disposed in a room temperature environment, while in other embodiments, the RF signal generator 302 is disposed at a given stage of a dilution refrigerator or cryostat. The RF signal generator 302 is configured to source suitable RF current. While FIG. 3 shows a single RF signal generator for the magnetic flux bias control system 300, it is to be understood that a single RF signal generator can be utilized to generate and apply RF signals to a plurality of magnetic flux bias control systems.

The switching circuit 314 comprises an input port $P_{IN}$, a first output port $P_{OUT1}$, and a second output port $P_{OUT2}$. The SFQ pulses, which are generated and output from the SFQ pulse generator circuit 312, are applied to the input port $P_{IN}$. The switching circuit 314 selectively outputs sequences of SFQ pulses from the first output port $P_{OUT1}$ or the second output port $P_{OUT2}$ in response to an external switch control signal applied to a control port of the switching circuit 314. An exemplary embodiment of the switching circuit 314 will be discussed below in conjunction with FIG. 5.

In some embodiments such as shown in FIG. 3, the switching circuit 314 will output a sequence of SFQ pulses (e.g., Set pulses) from the first output port $P_{OUT1}$, which are applied to the first FJTL circuit 120-1 to cause the first FJTL circuit 120-1 to incrementally inject positive current $I_P$ into the superconducting storage loop comprising the common flux bias line 142 and thereby incrementally increase a quantized amount of positive current $I_P$ that flows through the superconducting inductor 140. On the other hand, the switching circuit 314 will output a sequence of SFQ pulses (e.g., Reset pulses) from the second output port $P_{OUT2}$, which are applied to the second FJTL circuit 120-2 to cause the second FJTL circuit 120-2 to incrementally inject negative current $I_N$ into the superconducting storage loop comprising the common flux bias line 142 and thereby incrementally increase quantized amount of negative current $I_N$ that flows through the superconducting inductor 140.

Assuming a convention in which positive flux bias current flows/circulates in the superconducting storage loop of the magnetic flux bias control system 300 in a counterclockwise direction, the sequence of SFQ pulses (e.g., Set pulses) that are applied to the first FJTL circuit 120-1 cause an incremental increase in the quantized amount of flux bias current which flows in the superconducting storage loop. On the other hand, the sequence of SFQ pulses (e.g., Reset pulses) that are applied to the second FJTL circuit 120-2 cause a decremental decrease in the quantized amount of flux bias current which flows in the superconducting storage loop. By controlling the number, pattern and/or sequence of SFQ pulses that are selectively output from the first output port $P_{OUT1}$ and the second output port $P_{OUT2}$ of the switching circuit 314, the magnetic flux bias control system 300 can generate any arbitrary-amplitude time-varying magnetic flux bias signal to provide a desired quantized amount of flux biasing of the payload 150.

FIG. 3 illustrates an exemplary magnetic flux bias control system 300 which implements a single RF signal generator 302 and an SFQ switching circuit 314 to drive the first and second FJTL circuits 120-1 and 120-2. In an alternate embodiment, a magnetic flux bias control system can be implemented by eliminating the SFQ switching circuit 314 and utilizing (i) a first RF signal generator and a first SFQ pulse generator circuit to drive the first FJTL circuit 120-1, and (ii) a second RF signal generator and a second SFQ pulse generator circuit to drive the second FJTL circuit 120-2. In such embodiment, the operation of the first and second RF signal generators can be synchronized such that only one of the RF outputs of the first and second RF signal generators is active at a given time.

Figure 4:
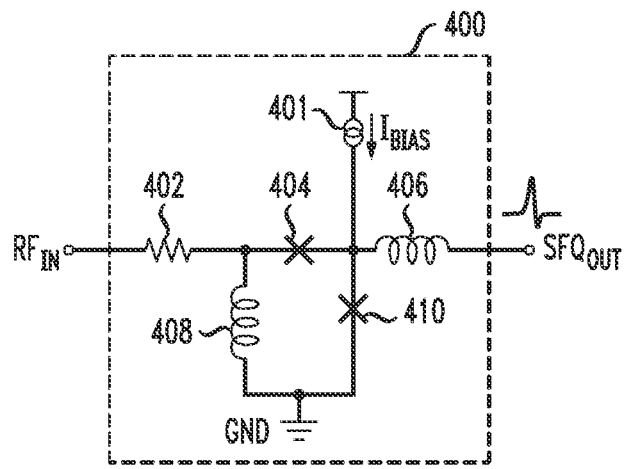
FIG. 4 schematically illustrates an SFQ pulse generator circuit which can be implemented in the magnetic flux bias control system of FIG. 3, according to an exemplary embodiment of the disclosure.

FIG. 4 schematically illustrates an SFQ pulse generator circuit which can be implemented in the magnetic flux bias control system of FIG. 3, according to an exemplary embodiment of the disclosure. In particular, FIG. 4 schematically illustrates an SFQ pulse generator circuit 400 which comprises an input port $RF_{IN}$, an output port $SFQ_{OUT}$, a DC current bias circuit 401, a resistor 402, a first Josephson junction 404, a first superconducting inductor 406, a second superconducting inductor 408, and a second Josephson junction 410. The resistor 402, the first Josephson junction 404, and the first superconducting inductor 406 are serially connected between the input port $RF_{IN}$ and the output port $SFQ_{OUT}$. The second superconducting inductor 408 and the second Josephson junction 410 have terminals that are coupled to the ground node GND.

The SFQ pulse generator circuit 400 is configured to receive an RF signal at the input port $RF_{IN}$ and generate a single SFQ pulse at the output port $SFQ_{OUT}$ for each period of the input RF signal. The SFQ pulse generator circuit 400 shown in FIG. 4 comprises a known DC/SFQ converter circuit architecture, the operating details of which are well-known and understood by those of ordinary skill in the art. The exemplary DC/SFQ converter circuit architecture of the SFQ pulse generator circuit 400 is capable of generating SFQ pulses over a wide range of frequencies, starting at very low frequencies (e.g., 100 kHz), which are effectively DC signals as compared to the high frequency of the SFQ pulses, up to relatively high frequencies (e.g., 50 GHz).

Figure 5:
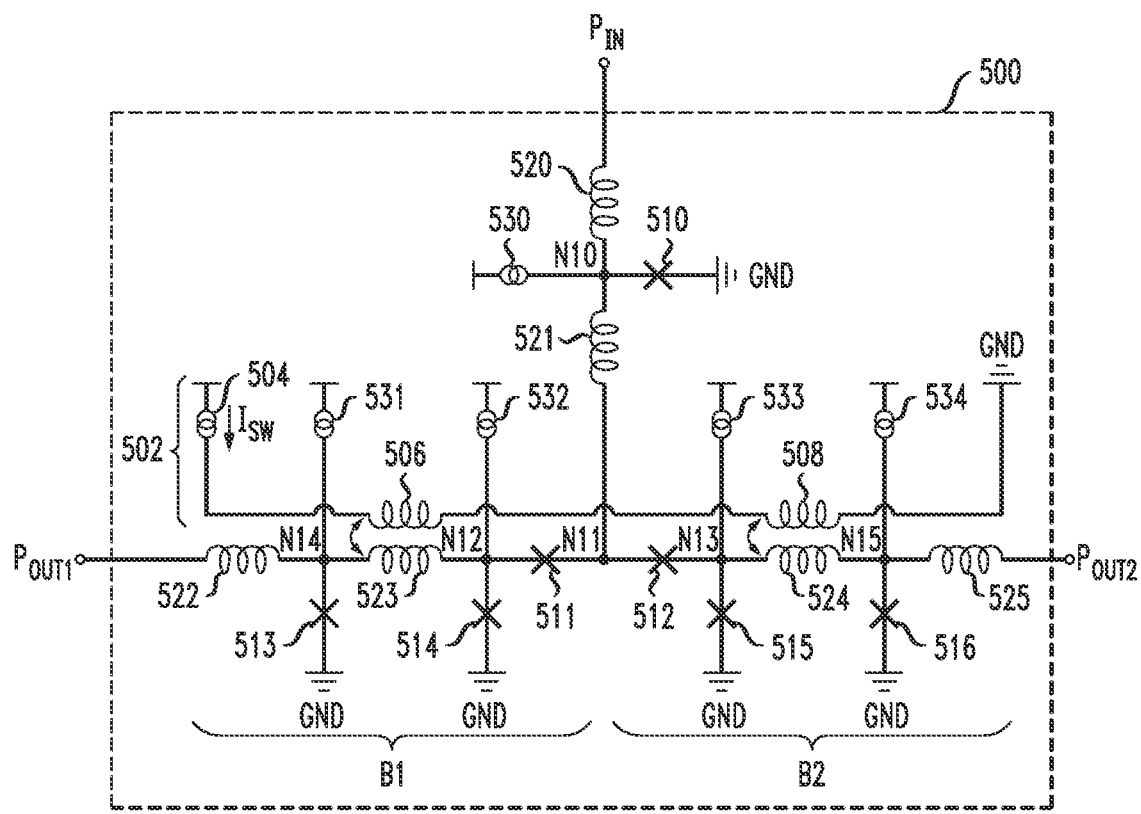
FIG. 5 schematically illustrates a switching circuit which can be implemented in the magnetic flux bias control system of FIG. 3, according to an exemplary embodiment of the disclosure.

FIG. 5 schematically illustrates a switching circuit which can be implemented in the magnetic flux bias control system 300 of FIG. 3, according to an exemplary embodiment of the disclosure. In particular, FIG. 5 schematically illustrates a switching circuit 500 which comprises a single pole, double throw (SPDT) SFQ switch architecture. The switching circuit 500 comprises a switch control circuit 502 which includes a control current generator 504 and superconducting inductors 506 and 508 which are serially connected to and between the control current generator 504 and the ground node GND. The control current generator 504 is configured to generate a switch control current $I_{SW}$ having a given magnitude and polarity to control the operation of the switching circuit 500, as explained in further detail below.

The switching circuit 500 comprises a SPDT switch circuit which comprises a plurality of Josephson junctions 510, 511, 512, 513, 514, 515, and 516, and a plurality of superconducting inductors 520, 521, 522, 523, 524, and 525, which form a first branch circuit B1 and a second branch circuit B2. In the first branch circuit B1, the superconducting inductor 523 is magnetically coupled to the superconducting inductor 506 of the switch control circuit 502. In the second branch circuit B2, the superconducting inductor 524 is magnetically coupled to the superconducting inductor 508 of the switch control circuit 502. The switching circuit 500 further comprises a plurality of bias current generator circuits 531, 532, 533, and 534, which are configured to generate respective static bias currents that are injected into respective nodes N14, N12, N13, and N15.

During operation, the flow of switch control current $I_{SW}$ of a given magnitude and a first polarity (e.g., positive polarity with current flow in a positive direction from the control current generator 504 to ground GND) "activates" the second branch circuit B2 and "deactivates" the first branch circuit B1, to thereby enable an SFQ pulse to be output from only the second output port $P_{OUT2}$ in response to an SFQ pulse applied to the input port $P_{IN}$. On the other hand, the flow of switch control current $I_{SW}$ of the given magnitude and a second polarity (e.g., negative polarity with current flow in a negative direction from ground GND to the control current generator 504) "activates" the first branch circuit B1 and "deactivates" the second branch circuit B2, to thereby enable an SFQ pulse to be output from only the first output port $P_{OUT1}$ in response to an SFQ pulse applied to the input port $P_{IN}$. When no switch control current is applied, no SFQ pulses are routed to either output.

More specifically, as shown in FIG. 5, the superconducting inductor 520 is coupled between the input port $P_{IN}$ and a node N10, and the Josephson junction 510 is coupled between the node N10 and the ground node GND. When an SFQ pulse is applied to the input port $P_{IN}$, the grounded Josephson junction 510 switches which causes the SFQ pulse to be generated at the node N10 between the superconducting inductors 520 and 521. The SFQ pulse at the node N10 causes an equal amount of current to flow into the first branch circuit B1 and the second branch circuit B2 of the switching circuit 500.

At this point, an SFQ pulse will be output from either the first output port $P_{OUT1}$ or the second output port $P_{OUT2}$, or from neither of the first and second output ports $P_{OUT1}$ and $P_{OUT2}$, depending on the state of the switch control current $I_{SW}$ in the switch control circuit 502. For example, if no switch control current $I_{SW}$ flows in the switch control circuit 502, the SFQ pulses delivered to node N11 (via superconducting inductor 521) are dropped across the series of Josephson junctions 511 and 512, respectively, and no SFQ pulse is generated at node N12 or node N13 (i.e., no SFQ pulse is output from either the first output port $P_{OUT1}$ or the second output port $P_{OUT2}$).

Moreover, if a positive switch control current $I_{SW}$ flows in the switch control circuit 502, a first circulating bias current is generated in the first branch circuit B1 as a result of the magnetic coupling between the superconducting inductors 506 and 523, and a second circulating bias current is generated in the second branch circuit B2 as a result of the magnetic coupling between the superconducting inductors 508 and 524. The circulating current flows in a counterclockwise direction in both branches. In the first branch circuit B1, this counterclockwise current under-biases the Josephson junction 514 causing the input SFQ pulse at node N11 to be dropped across the Josephson junction 511. Conversely, the counterclockwise circulating current in the second branch circuit B2 biases the Josephson junction 515 nearer to its critical current, allowing pulses applied to N11 to trigger the Josephson junctions 515 and 516 sequentially, producing an SFQ pulse at the node N15, which is then output from the second output port $P_{OUT2}$.

On the other hand, if a negative switch control current $I_{SW}$ flows in the switch control circuit 502, a first circulating bias current is generated in the first branch circuit B1 as a result of the magnetic coupling between the superconducting inductors 506 and 523, and a second circulating bias current is generated in the second branch circuit B2 as a result of the magnetic coupling between the superconducting inductors 508 and 524. In this instance, the circulating currents flow in the clockwise direction, which in the first branch circuit B1, brings the bias of the Josephson junction 514 nearer to its critical current while simultaneously lowering the bias of Josephson junction 515. When an SFQ pulse is applied to node N11, it triggers the Josephson junction 514 and the Josephson junction 513 to switch consecutively, producing an SFQ pulse at the node N14, which is then output from the first output port $P_{OUT1}$ while simultaneously it causes the Josephson junction 512 to switch in the second branch circuit B2, delivering no output pulse to the second output port $P_{OUT2}$.

Figure 6A:
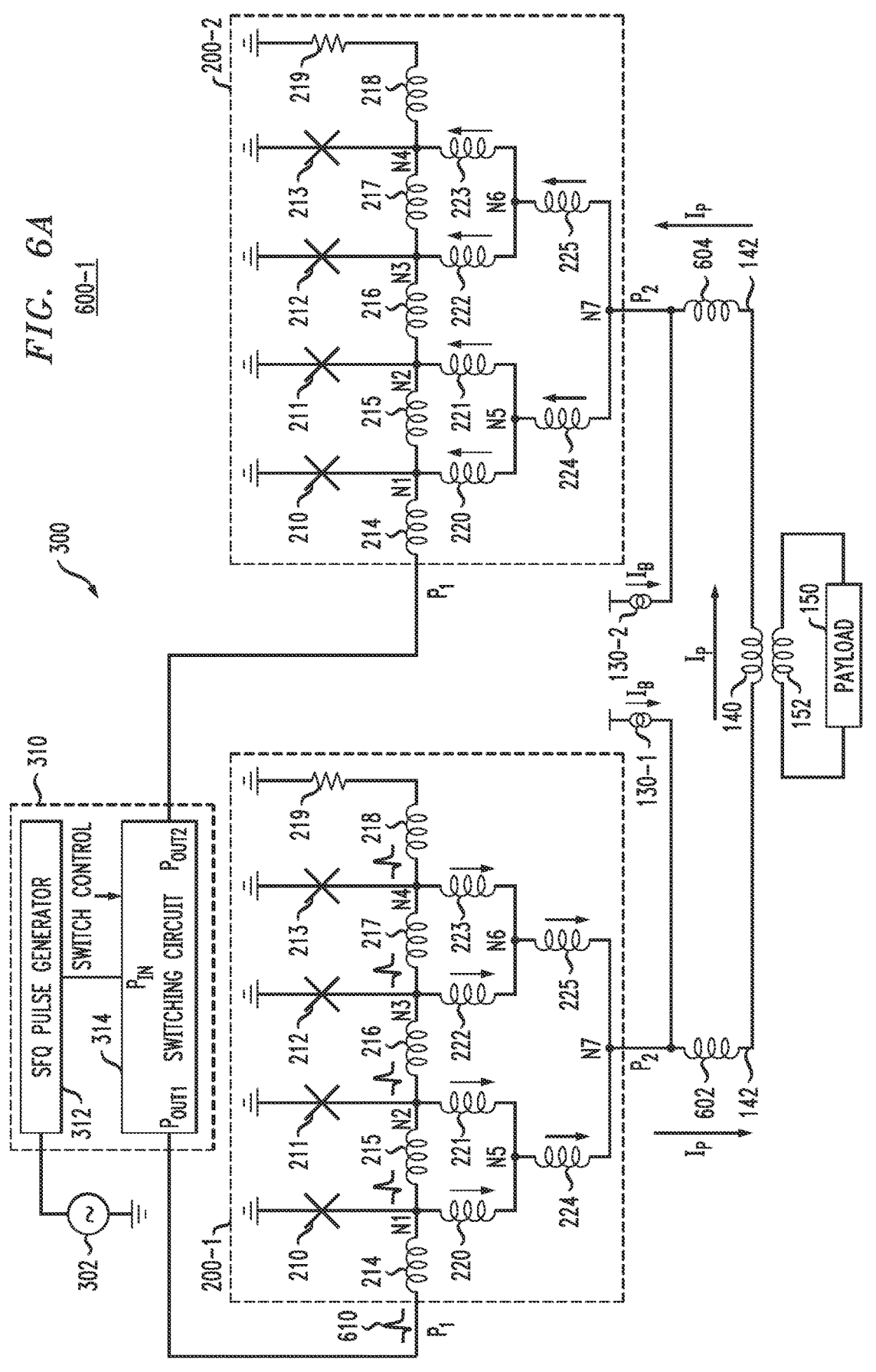
Figure 6B:
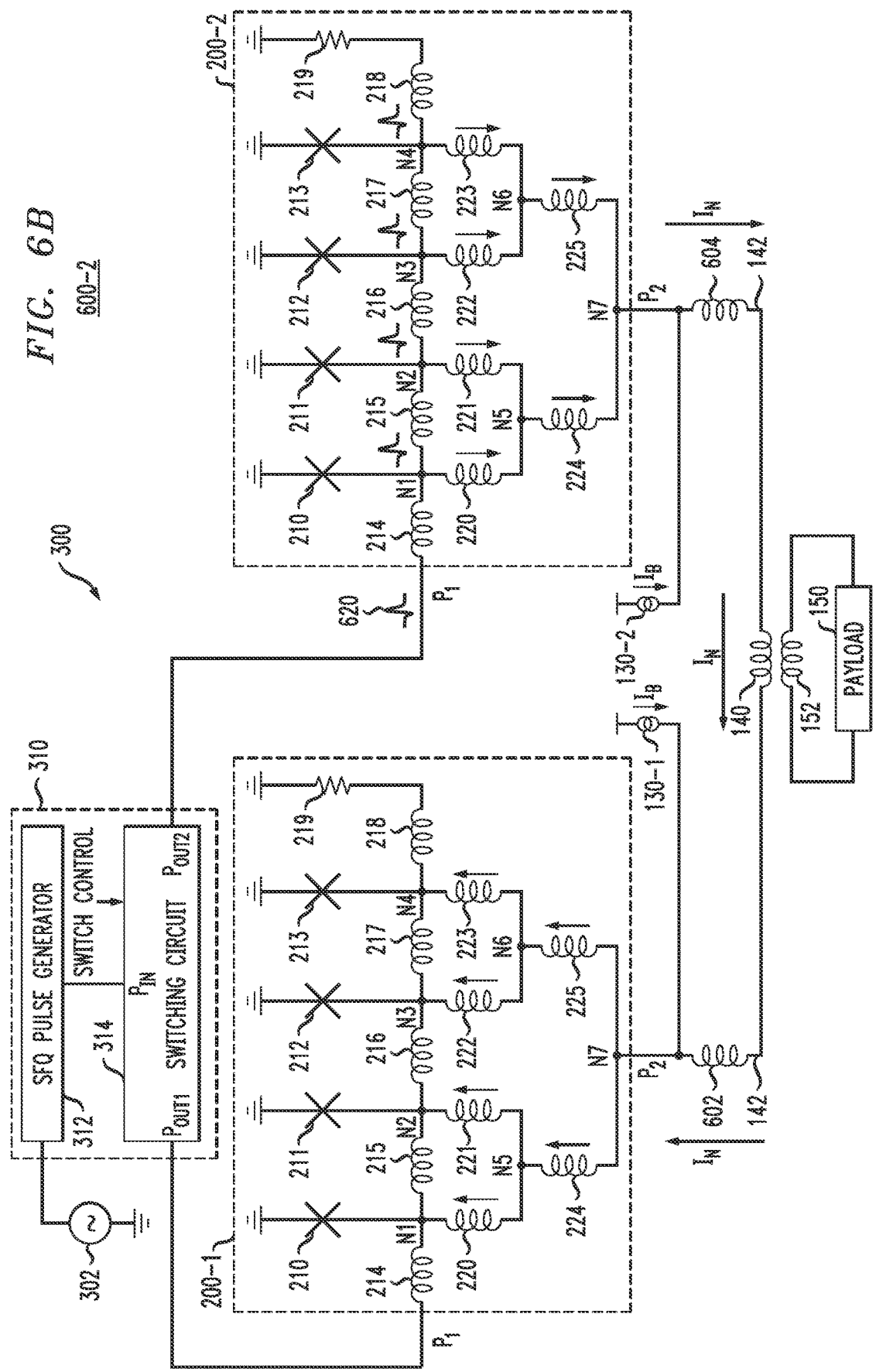

FIGS. 6A and 6B schematically illustrate operating modes of a magnetic flux bias control system, according to an exemplary embodiment of the disclosure. In particular, FIGS. 6A and 6B schematically illustrate operating modes of the magnetic flux bias control system 300 of FIG. 3, wherein the magnetic flux bias control system 300 comprises a first FJTL circuit 200-1 and a second FJTL circuit 200-2, each of which has the same circuit architecture as the FJTL circuit 200 discussed above in conjunction with FIG. 2. FIGS. 6A and 6B illustrate additional inductors 602 and 604 which represent respective line inductances of the portions of the flux bias line 142 which connect the output ports $P_2$ of the first and second FJTL circuits 200-1 and 200-2 to the respective first and second terminals of the superconducting (primary) inductor 140.

FIG. 6A schematically illustrates an operating mode 600-1 of the magnetic flux bias control system 300 when an SFQ pulse 610 (Set pulse) is output from the first output port $P_{OUT1}$ of the switching circuit 314 and applied to the input port P1 of the first FJTL circuit 200-1. In response to the SFQ pulse 610, the first FJTL circuit 200-1 injects a quantized amount of positive current $I_P$ into the superconducting storage loop comprising the common flux bias line 142 to thereby increment the quantized amount of positive current $I_P$ that flows through the superconducting inductor 140. The positive current $I_P$ flows into the second port $P_2$ of the second FJTL circuit 200-2, wherein the positive current $I_P$ is equally split into the different branches of the balanced inductor H-tree circuit of the second FJTL circuit 200-2 and shunted back to ground GND through the Josephson junctions 210, 211, 212, and 213 of the second FJTL circuit 200-2. In this instance, as schematically illustrated in FIG. 6A, the positive current $I_P$ circulates in a counterclockwise direction in the superconducting loop which is formed by the first and second FJTL circuits 200-1 and 200-2, the common flux bias line 142 connected to the second ports $P_2$, and the superconducting (primary) inductor 140.

FIG. 6B schematically illustrates an operating mode 600-2 of the magnetic flux bias control system 300 when an SFQ pulse 620 (Reset pulse) is output from the second output port $P_{OUT2}$ of the switching circuit 314 and applied to the input port $P_1$ of the second FJTL circuit 200-2. In response to the SFQ pulse 620, the second FJTL circuit 200-2 injects a quantized amount of negative current $I_N$ into the superconducting storage loop comprising the common flux bias line 142 to thereby increment the quantized amount of negative current $I_N$ that flows through the superconducting inductor 140. The negative current $I_N$ flows into the second port $P_2$ of the first FJTL circuit 200-1, wherein the negative current $I_N$ is equally split into the different branches of the balanced inductor H-tree circuit of the first FJTL circuit 200-1 and shunted back to ground GND through the Josephson junctions 210, 211, 212, and 213 of the first FJTL circuit 200-1. In this instance, as schematically illustrated in FIG. 6B, the negative current $I_N$ circulates in a clockwise direction in the superconducting storage loop which is formed by the first and second FJTL circuits 200-1 and 200-2, the common flux bias line 142 connected to the second ports $P_2$, and the superconducting (primary) inductor 140.

For ease of illustration and explanation, the exemplary operating modes 600-1 and 600-2 schematically shown in FIGS. 6A and 6B assume that the loop current in the superconducting storage loop is zero before applying the single SFQ pulse 610 (Set pulse) to the first FJTL circuit 200-1 (FIG. 6A) or before applying the single SFQ pulse 620 (Reset pulse) to the second FJTL circuit 200-2 (FIG. 6B). As noted above, however, in some embodiments, each SFQ pulse (Set pulse) applied to the first FJTL circuit 200-1 (FIG. 6A) will increment the circulating current in the superconducting storage loop by a quantized amount of current, while each SFQ pulse (reset pulse) applied to the second FJTL circuit 200-2 (FIG. 6B) will decrement the circulating current in the superconducting storage loop by a quantized amount of current. In this regard, the first FJTL circuit 200-1 operates as a first flux bias current generator circuit that is configured to inject positive flux bias current into the superconducting storage loop, while the second FJTL circuit 200-2 operates as a second flux bias current generator circuit that is configured to inject negative flux bias current into the superconducting storage loop.

Figure 7A:
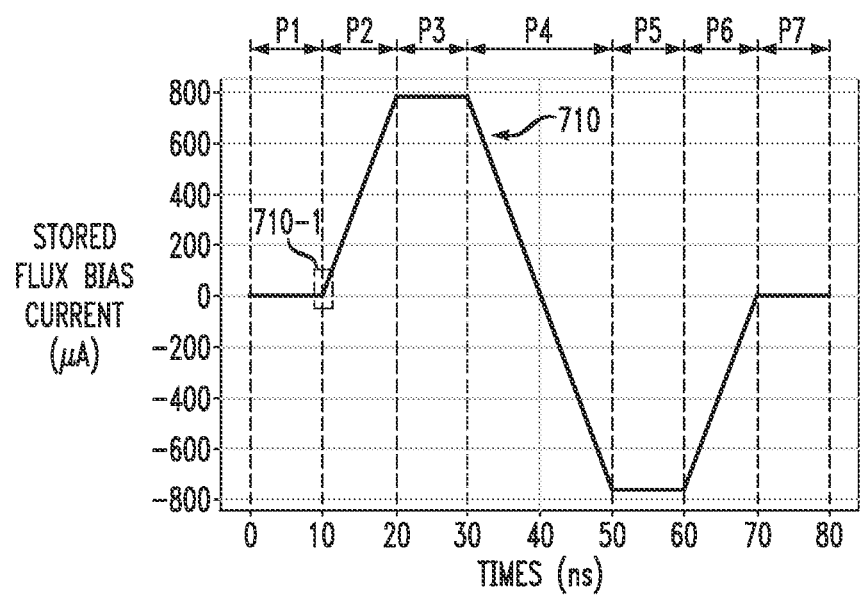
FIGS. 7A and 7B graphically illustrate simulated waveforms which show an operating mode of a magnetic flux bias control system, according to an exemplary embodiment of the disclosure.

An exemplary mode of operation of a magnetic flux bias control system will now be discussed in conjunction with FIGS. 7A and 7B. In particular, FIGS. 7A and 7B graphically illustrate simulated waveforms which show an operating mode of a magnetic flux bias control system, according to an exemplary embodiment of the disclosure. FIG. 7A is a graph 700 which illustrates an exemplary dynamic flux bias current waveform 710 generated by a simulated magnetic flux bias control system based on the magnetic flux bias control system 300 of FIG. 3, but where the SFQ switching circuit 314 is eliminated and where (i) a first RF signal generator (at 5 GHz) and a first SFQ pulse generator circuit are utilized to drive the first FJTL circuit 120-1 with SFQ pulses (Set pulses) to incrementally increase the quantized amount of circulating flux bias current in a superconducting storage loop, and (ii) a second RF signal generator (at 5 GHz) and a second SFQ pulse generator circuit are utilized to drive the second FJTL circuit 120-2 with SFQ pulses (Reset pulses) to discretely decrease the quantized amount of circulating flux bias current in the superconducting storage loop.

FIG. 7A shows time periods P1-P7 of the dynamic flux bias current waveform 710. For the time period P1 (from 0-10 nanoseconds (ns)), the dynamic flux bias current waveform 710 is zero microamps (μA) where no flux bias current is circulating in the superconducting storage loop. For the time period P2 (from 10 ns to 20 ns), the first FJTL circuit 120-1 is driven with a sequence of SFQ pulses (Set pulses) for 10 ns, which results in an increase in the quantized amount of circulating flux bias current from zero (0) μA to about +750 μA. For the time period P3 (from 20 ns to 30 ns), neither RF drive is operating such that no Set or Reset SFQ pulses are applied to the first and second FJTL circuits 120-1 and 120-2. As such, the circulating flux bias current remains constant at about +750 μA during the time period P3.

Next, for the time period P4 (from 30 ns to 50 ns), the second FJTL circuit 120-2 is driven with a sequence of SFQ pulses (Reset pulses) for 20 ns, which results in a decrease in the quantized amount of circulating flux bias current from about +750 μA to about −750 μA. For the time period P5 (from 50 ns to 60 ns), neither RF drive is operating such that no Set or Reset SFQ pulses are applied to the first and second FJTL circuits 120-1 and 120-2. As such, the circulating flux bias current remains constant at about −750 μA during the time period P5.

Next, for time period P6 (from 60 ns to 70 ns), the first FJTL circuit 120-1 is driven with a sequence of SFQ pulses (Set pulses) for 10 ns, which results in an increase in the quantized amount of circulating flux bias current from about −750 μA to about 0 μA. For the time period P7 (from 70 ns to 80 ns), neither RF drive is operating such that no Set or Reset SFQ pulses are applied to the first and second FJTL circuits 120-1 and 120-2. As such, the circulating flux bias current remains constant at about 0 μA during the time period P7.

While FIG. 7A illustrates the increasing and decreasing current ramps of the dynamic flux bias current waveform 710 as straight lines, the increasing and decreasing current ramps are actually staircase-shaped ramps, where each step results from one quantum flux amount of flux bias current applied to the superconducting storage loop comprising the superconducting inductor (e.g., superconducting (primary) inductor 140 as shown in FIG. 3). For example, a portion 710-1 of the dynamic flux bias current waveform 710 is shown in FIG. 7B. In particular, FIG. 7B depicts a detailed (exploded) view of the portion 710-1 of the dynamic flux bias current waveform 710 for the time period from 9.5 ns to about 11.25 ns where the flux bias current incrementally increases in response to each Set SFQ pulse. FIG. 7B graphically illustrates a staircase pattern which comprises a plurality of incremental steps 712, where each step 712 results from one quantum flux amount of bias current that is injected into the superconducting storage loop from the first FJTL circuit 120-1 in response to each Set SFQ pulse. Similarly, for those portions of the dynamic flux bias current waveform 710 where the flux bias current ramps down, the decreasing ramp will have a staircase pattern where each step down represents a discrete decrease in the flux bias current in response to each Reset SFQ pulse applied to the second FJTL circuit 120-2.

Figure 7B:
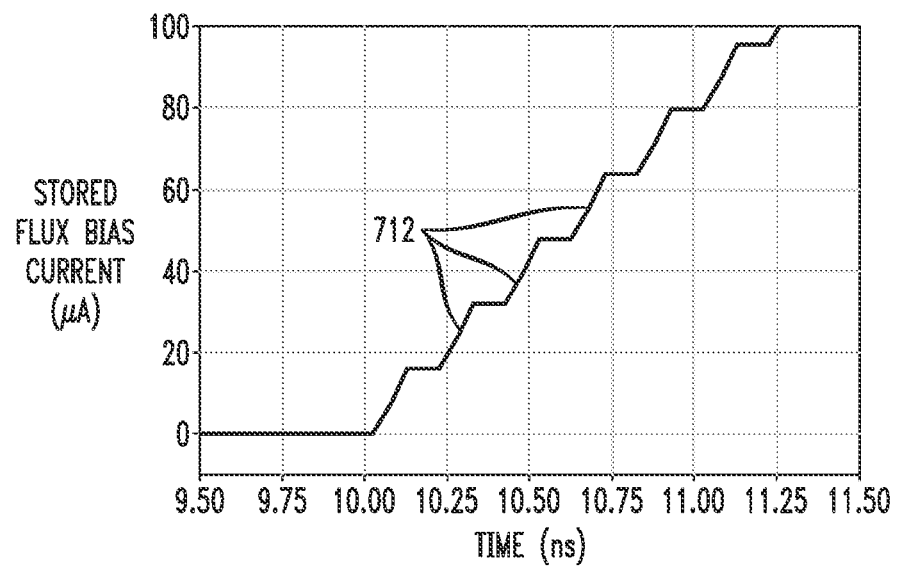

While FIGS. 7A and 7B illustrate an exemplary dynamic flux bias current profile that is generated by applying a given sequence/pattern of Set and Reset SFQ pulses for the exemplary time durations shown in FIG. 7A, it is to be appreciated that as noted above, a magnetic flux bias control system can be configured to generate any arbitrary time-varying flux bias current profile by adjusting the sequence/pattern of Set and Reset SFQ pulses that are applied to, e.g., the first and second FJTL circuits 120-1 and 120-2, and/or by adjusting one or more other operating parameters.

For example, assume that (i) $n_{JJ}$ denotes a number of Josephson junctions for a given FJTL circuit, (ii) $L_S$ denotes the inductance of the quantizing superconducting (primary) inductor, (iii)

$$\Delta I_{JJ} = \frac{\Phi_0}{n_{JJ} \times L_S}$$

denotes a change in loop current that occurs upon the switching of a given Josephson junction, (iv)

$$\Delta I_{FJTL} = \Delta I_{JJ} \times n_{JJ} = \frac{\Phi_0}{n_{JJ} \times L_S} \times n_{JJ} = \frac{\Phi_0}{L_S}$$

denotes a total amount of loop current that is provided by a given FJTL circuit in response to a single SFQ pulse applied to the given FJTL circuit, and (v) $I_{loop} = \Delta I_{FJTL} \times n_{SFQ}$ denotes a total amount of loop current that is provided by the given FJTL circuit in response to a given number of successive SFQ pulses, denoted as $n_{SFQ}$. From the above equations, we see that the step size $\Delta I_{FJTL}$ (or the waveform shape) is not dependent on the number of Josephson junctions $n_{JJ}$ per FJTL circuit. On the other hand, the number of Josephson junctions $n_{JJ}$ affects the maximum amount of current the circuit may generate.

In an exemplary embodiment, assume that a given FJTL circuit comprises $n_{JJ}=20$ Josephson junctions each having the same (or substantially the same) critical current, e.g., $I_C=250$ μA, wherein the given FJTL circuit receives a static bias current of about 4.0 mA which is distributed evenly among the $n_{JJ}=20$ Josephson junctions. Assume further that the quantizing superconducting (primary) inductor has an inductance of 138 pH.

In the illustrative embodiment, the total amount of loop current that is provided by each Josephson junction of the given FJTL circuit in response to a single SFQ pulse applied to the given FJTL circuit is computed as $$\Delta I_{JJ} = \frac{\Phi_0}{n_{JJ} \times L_S} = \frac{\Phi_0}{20 \times 138 \text{ pH}} \approx 750 \text{ nA}.$$

Further, the total amount of loop current that is provided by the given FJTL circuit in response to a single SFQ pulse applied to the given FJTL circuit is $\Delta I_{FJTL} = J_{JJ} \times n_{JJ} = 750$ nA×20≈15 µA. Further assuming a drive frequency $f_D$=5 GHz applied for a time duration t=10 ns, the total amount of loop current that is provided by the given FJTL circuit in response to a given number of successive SFQ pulses is determined as $I_{loop}=\Delta I_{FJTL} \times n_{SFQ} = I_{FJTL} \times (f_D \times t)$=15 µA×5 GHz×10 ns≈750 µA. FIGS. 7A and 7B schematically illustrate the results of such computations where, for example, FIG. 7A graphically illustrates a 750 µA increase in the stored flux bias current waveform 710 for the 10 ns period P2, and FIG. 7B shows that each current step 712 in the stored flux bias current waveform 710 is $\Delta I_{FJTL}$≈15 µA. As noted above, the step size $\Delta I_{FJTL}$ (or the waveform shape) is not dependent on the number of Josephson junctions $n_{JJ}$ per FJTL circuit.

While FIGS. 7A and 7B illustrate an exemplary dynamic flux bias current profile, it is to be appreciated that the magnetic flux bias control system can generate static flux bias currents. For example, to generate a positive static flux bias current, a sequence of Set SFQ pulses can be applied to the first FJTL circuit 120-1 to incrementally increase the flux bias current from zero to a target (positive) magnitude, and then terminate the SFQ pulse input to the first FJTL circuit 120-1 so that the positive circulating flux bias current in the superconducting storage loop remains constant. Similarly, to generate a negative static flux bias current, a sequence of Reset SFQ pulses can be applied to the second FJTL circuit 120-2 to discretely decrease the flux bias current from zero to a target (negative) magnitude, and then terminate the SFQ pulse input to the second FJTL circuit 120-2 so that the negative circulating flux bias current in the superconducting storage loop remains constant.

It is to be further appreciated that in instances where the magnetic flux bias control system is configured to generate static flux bias currents, once a desired magnitude of flux bias current is generated and circulating in the superconducting storage loop, the DC bias power to the first and second FJTL circuits 120-1 and 120-2 can be turned off to save power, as no static bias current needs be generated to bias the Josephson junctions of the first and second FJTL circuits 120-1 and 120-2. In this instance, the circulating static flux bias current in the superconducting storage loop will continue flowing without the DC bias power applied to the first and second FJTL circuits 120-1 and 120-2. This feature is significantly advantageous for quantum computing applications where limited power usage is highly desirable.

FIG. 8 schematically illustrates a magnetic flux bias control system, according to another exemplary embodiment of the disclosure. In particular, FIG. 8 schematically illustrates a magnetic flux bias control system 800 which is similar to the magnetic flux bias control system 100 of FIG. 1A, except that the magnetic flux bias control system 800 comprises SFQ control circuitry 810 which comprises a toggle flip-flop (TFF) circuit 812, a first pulse multiplier circuit 814-1, and a second pulse multiplier circuit 814-2. The SFQ control circuitry 810 in FIG. 8 illustrates an exemplary embodiment of the SFQ control circuitry 110 of FIG. 1A. The TFF circuit 812 comprises an input port TIN, a first output port $Q_1$ and a second output port $Q_2$. The first pulse multiplier circuit 814-1 comprises (i) an input port coupled to the first output port $Q_1$ of the TFF circuit 812 and (ii) an output port coupled to the first port $P_1$ of the first FJTL circuit 120-1. The second pulse multiplier circuit 814-2 comprises (i) an input port coupled to the second output port $Q_2$ of the TFF circuit 812 and (ii) an output port coupled to the first port $P_1$ of the second FJTL circuit 120-2.

The magnetic flux bias control system 800 operates in response to trigger SFQ pulses (e.g., Set and Reset pulses) that are input to a trigger input port (denoted Trigger IN) of the magnetic flux bias control system 800, wherein each trigger SFQ pulse is input with a specified controlled time delay ($\Delta$t), which toggles the SFQ output of the TFF circuit 812. For example, in response to a first trigger SFQ pulse 820 (e.g., Set pulse) applied to the input port $T_{IN}$ of the TFF circuit 812, the TFF circuit 812 outputs a single SFQ pulse 822 from the first output port $Q_1$. The SFQ pulse 822 is input to the first pulse multiplier circuit 814-1 and, in response, the first pulse multiplier circuit 814-1 outputs a sequence of SFQ pulses 824. The sequence of SFQ pulses 824 is applied to the first port P1 of the first FJTL circuit 120-1, wherein the first FJTL circuit 120-1 operates to incrementally increase the positive current $I_P$ in the superconducting storage loop by a quantized amount of current for each SFQ pulse in the sequence of SFQ pulses 824. The incremental increase of the positive current $I_P$ results in an increase in the flux bias current circulating in the superconducting storage loop.

Next, after the specified time delay ($\Delta$t), the second trigger SFQ pulse 830 (e.g., Reset pulse) is applied to the input port $T_{IN}$ of the TFF circuit 812, and the TFF circuit 812 outputs a single SFQ pulse 832 from the second output port $Q_2$. The SFQ pulse 832 is input to the second pulse multiplier circuit 814-2 and, in response, the second pulse multiplier circuit 814-2 outputs a sequence of SFQ pulses 834. The sequence of SFQ pulses 834 is applied to the first port P1 of the second FJTL circuit 120-2, wherein the second FJTL circuit 120-2 operates to incrementally increase the negative current $I_N$ in the superconducting storage loop by a quantized amount of current for each SFQ pulse in the sequence of SFQ pulses 834. The incremental increase in the negative current $I_N$ essentially decrements the flux bias current circulating in the superconducting storage loop.

In some embodiments, the number (n) of SFQ pulses that are generated by the first pulse multiplier circuit 814-1 and the second pulse multiplier circuit 814-2 in response to a single input SFQ pulse is fixed. For example, in the exemplary non-limiting embodiment shown in FIG. 8, the first pulse multiplier circuit 814-1 and the second pulse multiplier circuit 814-2 generate four (4) SFQ pulses in response to one SFQ pulse. In some embodiments, the first pulse multiplier circuit 814-1 and the second pulse multiplier circuit 814-2 are configured to generate the same fixed number n of SFQ pulses. In some embodiments, the first pulse multiplier circuit 814-1 and the second pulse multiplier circuit 814-2 are configured to generate a different fixed number of SFQ pulses. In some embodiments, the first pulse multiplier circuit 814-1 and the second pulse multiplier circuit 814-2 have programmable logic in which the number of SFQ pulses that are generated by the first pulse multiplier circuit 814-1 and the second pulse multiplier circuit 814-2 (in response to a single SFQ pulses) can be programmed to any desired number of pulses, depending on the application. The first pulse multiplier circuit 814-1 and the second pulse multiplier circuit 814-2 can be implemented using any suitable circuit architecture such as non-programmable (fixed) or programmable counters, exemplary embodiments of which are shown in FIGS. 9A and 9B.

For example, FIG. 9A schematically illustrates a pulse multiplier circuit which can be implemented in the magnetic flux bias control system of FIG. 8, according to an exemplary embodiment of the disclosure. In particular FIG. 9A schematically illustrates a pulse multiplier circuit 900 which comprises a first input port 902 to receive an input SFQ trigger pulse, a second input port 904 to receive a clock signal CLK, an output port 906 to output SFQ pulses to a FJTL circuit, a ripple counter 910, a plurality of data (D)

latches 920, a feedback line 922, a D latch 926 ($D_0$), a timed inverter 924, and an input D latch 930 ($D_T$). The pulse multiplier circuit 900 is configured to generate a fixed number of SFQ pulses, e.g., $1:2^N$ SFQ pulses, in response to a single trigger SFQ pulse applied to the first input port 902 and latched into the input D latch 930.

The ripple counter 910 comprises a plurality (N) of toggle flip-flops $T_1, T_2, T_3, T_4, \ldots, T_N$. The plurality of D latches 920 comprise a number (N) of D latches $D_1, D_2, D_3, D_4, \ldots, D_N$ which, together with the toggle flip-flops $T_1, T_2, T_3, T_4, \ldots, T_N$, form a low-skew frequency divider circuit. A feedback loop is created by connecting (via the feedback line 922) an output of the frequency divider back to an input of the frequency divider through the timed inverter 924 and the D latch $D_0$. The burst of SFQ output pulses from the output port 906 begins when a trigger SFQ pulse, which is latched into the input D latch 930 ($D_T$), is loaded into the D latch $D_0$. Upon each successive CLK pulse, the D latch $D_0$ is destructively read out, an output SFQ pulse is generated which clocks both the frequency divider and the timed inverter 924, and the output of the timed inverter 924 reloads the D latch $D_0$. This cycle is repeated until the frequency divider produces an SFQ output pulse which loads the timed inverter 924 with a binary 1. Upon the next CLK pulse, an SFQ output pulse is generated, but the D latch $D_0$ is not reloaded since the timed inverter 924 generates no SFQ output pulse (binary 0). No more SFQ pulses are generated until the D latch $D_0$ is loaded by a next SFQ trigger pulse. The number of SFQ pulses that are output from the output port 906 in response to a single SFQ trigger pulse is $2^N$ where N is the number N of stages in the frequency divider. For example, when N=5, a single SFQ trigger pulse applied to the first input port 902 will result in 32 SFQ pulses to be output from the output port 906.

FIG. 9B schematically illustrates a programmable delay circuit, which can be used to implement a programmable pulse multiplier circuit for the magnetic flux bias control system of FIG. 8, according to another exemplary embodiment of the disclosure. In particular FIG. 9B schematically illustrates a programmable delay circuit 950 which can be utilized to implement a programmable pulse multiplier circuit to generate a desired number of SFQ output pulses in response to a single input SFQ trigger pulse. The programmable delay circuit 950 comprises a first input port 952 to receive an input SFQ trigger pulse, a second input port 954 to receive a clock signal CLK, a first output port 956 to output a "START" pulse, a second output port 958 to output a "STOP" pulse, a ripple counter 960, a plurality of switches $S_0, S_1, S_2, S_3, S_4, \ldots, S_N$, a first row of D latches, $D_{0A}, D_{1A}, D_{2A}, D_{3A}, D_{4A}, \ldots, D_{NA}$, and a second row of D latches, $D_{0B}, D_{1B}, D_{2B}, D_{3B}, D_{4B}, \ldots, D_{NB}$. The ripple counter 960 comprises a plurality (N+1) of toggle flip-flops $T_0, T_1, T_2, T_3, T_4, \ldots, T_N$. The complementary and non-complementary outputs of the toggle flip-flops $T_0, T_1, T_2, T_3, T_4, \ldots, T_N$ are used to clock the first and second rows of D latches. The D latches of the first row of D latches, $D_{0A}, D_{1A}, D_{2A}, D_{3A}, D_{4A}, \ldots, D_{NA}$, are always clocked by the complementary outputs of the toggle flip-flops $T_0, T_1, T_2, T_3, T_4, \ldots, T_N$. The D latches of the second row of D latches, $D_{0B}, D_{1B}, D_{2B}, D_{3B}, D_{4B}, \ldots, D_{NB}$, can be either clocked by complementary or non-complementary outputs of the toggle flip-flops $T_0, T_1, T_2, T_3, T_4, \ldots, T_N$, depending on the positions of switches $S_0, S_1, S_2, S_3, S_4, \ldots, S_N$.

The programmable delay circuit 950 operates in the following manner. First a trigger SFQ pulse is applied to the first input port 952 and loaded into both D latches DNA and $D_{NB}$. The trigger SFQ pulse is then transferred from D latch to D latch along the first and second rows of D latches (from right to left in FIG. 9B) as each D latch is clocked by a complementary or non-complementary output of one of the toggle flip-flops $T_0, T_1, T_2, T_3, T_4, \ldots, T_N$, until eventually an output SFQ pulse (START pulse) is generated on the first output port 956 and an output SFQ pulse (STOP pulse) is generated on the second output port 958. If all of the switches $S_0, S_1, S_2, S_3, S_4, \ldots, S_N$ are in the 0 position, the pipelining latency along the first row of D latches $D_{0A}, D_{1A}, D_{2A}, D_{3A}, D_{4A}, \ldots$, DNA matches the pipelining latency along the second row of D latches $D_{0B}, D_{1B}, D_{2B}, D_{3B}, D_{4B}, \ldots, D_{NB}$, so the START and STOP output SFQ pulses appearing at the respective first and second output ports 956 and 958 are generated on the same cycle of CLK. If one or more of the switches is moved to the 1 position, the output SFQ pulse (STOP pulse) at the second output port 958 is delayed relative to the output SFQ pulse (START pulse) at the first output port 956.

In general, switching a given switch $S_k$ from 0 to 1 increases the pipelining latency by $2^k$ CLK cycles, so the relative delay (in CLK periods) between the START and STOP SFQ output pulses equals the (N+1)-bit code given by $S_0$-$S_N$ (from 0 to $2^{N+1}-1$). To realize a programmable pulse multiplier circuit (e.g., for the magnetic flux bias control system of FIG. 8), the START SFQ output pulse can be used to initiate a sequence of SFQ pulses repeating at a frequency of CLK, and the STOP SFQ output pulse can be used to terminate the sequence. The number of SFQ pulses generated in the sequence equals the delay (in CLK periods) between the START and STOP SFQ output pulses, which is programmed with the switches $S_0, S_1, S_2, S_3, S_4, \ldots, S_N$.

Figure 10:
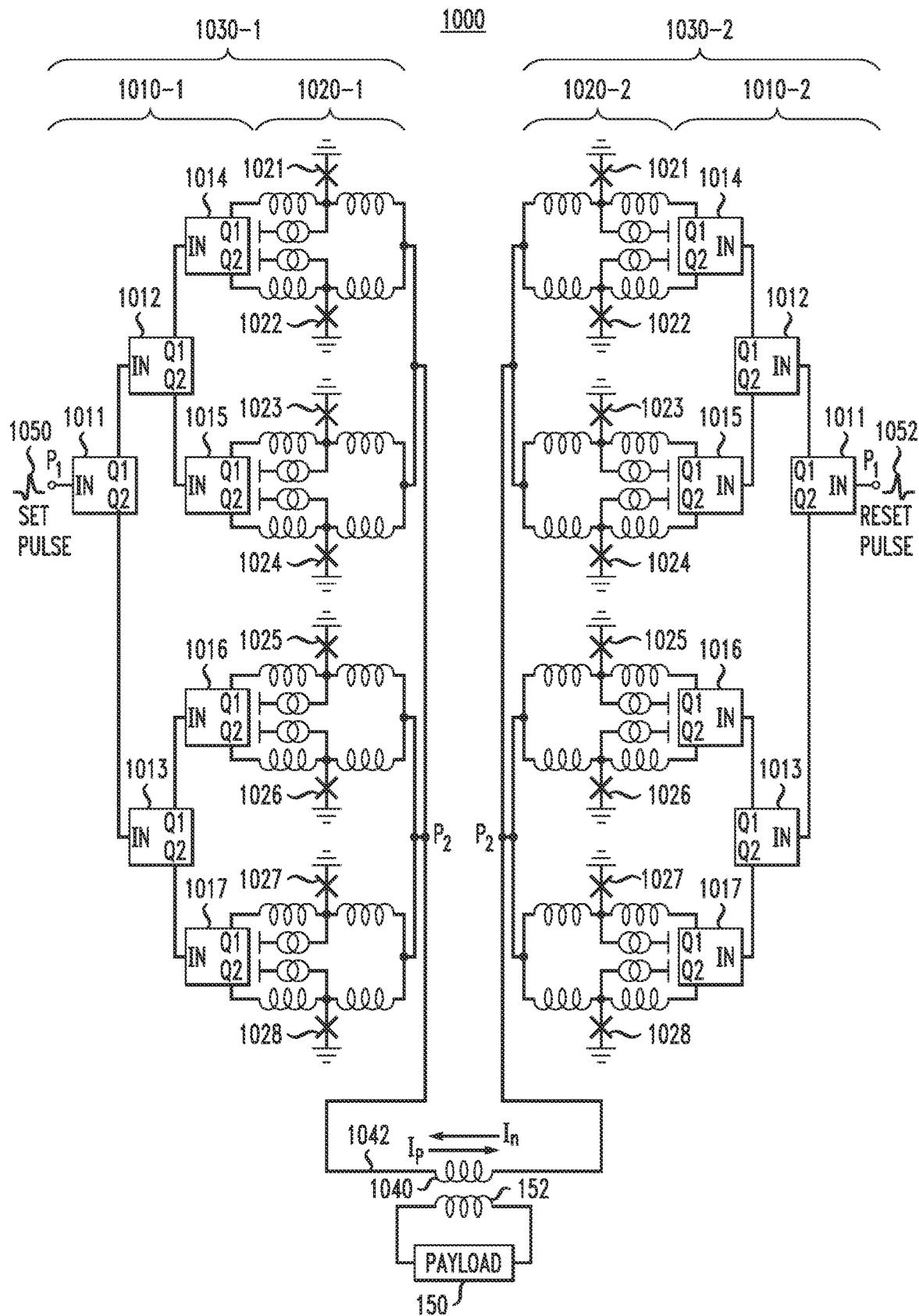
FIG. 10 schematically illustrates a magnetic flux bias control system, according to another exemplary embodiment of the disclosure.

FIG. 10 schematically illustrates a magnetic flux bias control system, according to another exemplary embodiment of the disclosure. In particular, FIG. 10 schematically illustrates a magnetic flux bias control system 1000 which comprises a first SFQ splitter tree 1010-1, a second SFQ splitter tree 1010-2, a first Josephson junction stage 1020-1, and a second Josephson junction stage 1020-2. The first SFQ splitter tree 1010-1 and the first Josephson junction stage 1020-1 form a first balanced tree circuit structure 1030-1 having a first port $P_1$ and a second port $P_2$. The second SFQ splitter tree 1010-2 and the second Josephson junction stage 1020-2 form a second balanced tree circuit structure 1030-2 having a first port $P_1$ and a second port $P_2$. The first and second balanced tree circuit structures 1030-1 and 1030-2 are coupled through a superconducting inductor 1040, which comprises a quantizing inductance value.

In an exemplary embodiment, the first and second balanced tree circuit structures 1030-1 and 1030-2 have a same circuit architecture. For example, in the exemplary embodiment shown in FIG. 10, the first and second SFQ splitter trees 1010-1 and 1010-2 have a same binary tree circuit architecture, which comprises a plurality of SFQ splitter circuits 1011, 1012, 1013, 1014, 1015, 1016, and 1017 (or SFQ splitter gates). Each SFQ splitter circuit 1011, 1012, 1013, 1014, 1015, 1016, and 1017 comprises an input port IN and two output ports Q1 and Q2. Moreover, in the exemplary embodiment shown in FIG. 10, the first and second Josephson junction stages 1020-1 and 1020-2 have a same circuit architecture, which comprises a plurality of Josephson junctions 1021, 1022, 1023, 1024, 1025, 1026, 1027, and 1028 (as well as superconducting inductors and DC bias current circuits as shown). In an exemplary embodiment, the Josephson junctions 1021, 1022, 1023, 1024, 1025, 1026, 1027, and 1028 of the first and second Josephson junction stages 1020-1 and 1020-2 are designed to have the same critical current $I_C$.

The first SFQ splitter tree 1010-1 provides a fanout structure to distribute an input SFQ pulse 1050 (e.g., Set pulse), which is applied to the first port $P_1$, to each of the Josephson junctions 1021, 1022, 1023, 1024, 1025, 1026, 1027, and 1028 of the first Josephson junction stage 1020-1. In particular, as shown in FIG. 10, the SFQ splitter circuit 1011 receives an input SFQ pulse 1050 (e.g., Set pulse) and outputs an SFQ pulse from each of its first and second output ports Q1 and Q2. The SFQ pulses are applied to the respective inputs ports IN of the SFQ splitter circuits 1012 and 1013. In response, the SFQ splitter circuit 1012 outputs an SFQ pulse from each of its first and second output ports Q1 and Q2, which are applied to the respective inputs ports IN of the SFQ splitter circuits 1014 and 1015. In addition, the SFQ splitter circuit 1013 outputs an SFQ pulse from each of its first and second output ports Q1 and Q2, which are applied to the respective inputs ports IN of the SFQ splitter circuits 1016 and 1017.

In response to the input SFQ pulses, the SFQ splitter circuits 1014, 1015, 1016, and 1017 output SFQ pulses from each of their respective first and second output ports Q1 and Q2. The output SFQ pulses from the SFQ splitter circuits 1014, 1015, 1016, and 1017 are applied to the first Josephson junction stage 1020-1, which causes each of the Josephson junctions 1021, 1022, 1023, 1024, 1025, 1026, 1027, and 1028 of the first Josephson junction stage 1020-1 to switch and inject a quantized amount of positive current $I_P$ from the second port $P_2$ onto a common flux bias line 1042 of a superconducting storage loop.

In this instance, the second Josephson junction stage 1020-2 serves as a sink for the positive current $I_P$ wherein the positive current $I_P$ enters the second port $P_2$ of the second Josephson junction stage 1020-2 and is evenly divided and distributed to each Josephson junction 1021, 1022, 1023, 1024, 1025, 1026, 1027, and 1028 of the second Josephson junction stage 1020-2 (through a current distribution network formed by inductors and an H-tree interconnect structure, as shown). With this circuit configuration, the Josephson junctions 1021, 1022, 1023, 1024, 1025, 1026, 1027, and 1028 of the second Josephson junction stage 1020-2 are configured to absorb and shunt the equally divided loop current to the ground node GND without causing the Josephson junctions 1021, 1022, 1023, 1024, 1025, 1026, 1027, and 1028 to switch as a result of too high a current flowing through a Josephson junction (i.e., above the critical current of the Josephson junction).

The second SFQ splitter tree 1010-2 provides a fanout structure to distribute an input SFQ pulse 1052 (e.g., Reset pulse), which is applied to the first port $P_1$ thereof, to each of the Josephson junctions 1021, 1022, 1023, 1024, 1025, 1026, 1027, and 1028 of the second Josephson junction stage 1020-2, in the same manner as discussed above, the details of which will not be repeated. The output SFQ pulses from the respective output ports Q1 and Q2 of the SFQ splitter circuits 1014, 1015, 1016, and 1017 of the second SFQ splitter tree 1010-2 are applied to the second Josephson junction stage 1020-2, which causes each of the Josephson junctions 1021, 1022, 1023, 1024, 1025, 1026, 1027, and 1028 of the second Josephson junction stage 1020-2 to switch and inject a quantized amount of negative current $I_N$ from the second port $P_2$ of the second balanced tree circuit structure 1030-2 on the common flux bias line 1042 of the superconducting storage loop.

In this instance, the first Josephson junction stage 1020-1 serves as a sink for the negative current $I_N$, wherein the negative current $I_N$ enters the second port $P_2$ of the first balanced tree circuit structure 1030-1 and is evenly divided and distributed to each Josephson junction 1021, 1022, 1023, 1024, 1025, 1026, 1027, and 1028 of the first Josephson junction stage 1020-1 (through a current distribution network formed by inductors and an H-tree interconnect structure, as shown). With this circuit configuration, the Josephson junctions 1021, 1022, 1023, 1024, 1025, 1026, 1027, and 1028 of the first Josephson junction stage 1020-1 are configured to absorb and shunt the equally divided loop current to the ground node GND without causing the Josephson junctions 1021, 1022, 1023, 1024, 1025, 1026, 1027, and 1028 to switch as a result of too high a current flowing through a Josephson junction (i.e., above the critical current of the Josephson junction).

FIG. 10 illustrates an exemplary embodiment in which each Josephson junction 1021, 1022, 1023, 1024, 1025, 1026, 1027, and 1028 of the first and second Josephson junction stages 1020-1 and 1020-2 is biased by a dedicated current bias source. In this instance, the current distribution networks which couple the output ports P2 to the Josephson junctions 1021, 1022, 1023, 1024, 1025, 1026, 1027, and 1028 of the first and second Josephson junction stages 1020-1 and 1020-2 are not used to evenly distribute bias current to the Josephson junctions of the first and second Josephson junction stages 1020-1 and 1020-2. In other embodiments, the first and second Josephson junction stages 1020-1 and 1020-2 can be implemented with current distribution networks which are the same as or similar to the balanced inductor H-tree circuit structure as shown in FIG. 2, for example.

With the exemplary architecture shown in FIG. 10, the first and second Josephson junction stages 1020-1 and 1020-2, the common flux bias line 1042, and the superconducting inductor 1040 collectively form a superconducting storage loop that stores the circulating flux bias current which is generated by the magnetic flux bias control system 1000 and which flows through the superconducting primary inductor 1040 to generate a magnetic flux bias that is coupled to the payload circuit 150 through, e.g., the secondary superconducting inductor 152. Each SFQ pulse (Set pulse) applied to the first port $P_1$ of the first balanced tree circuit structure 1030-1 will increment the circulating current in the superconducting storage loop by a quantized amount of current, while each SFQ pulse (Reset pulse) applied to the first port $P_1$ of the second balanced tree circuit structure 1030-2 will decrement the circulating current in the superconducting storage loop by a quantized amount of current.

FIG. 10 illustrates a non-limiting exemplary embodiment in which the first and second SFQ splitter trees 1010-1 and 1010-2 each have three (3) levels, e.g., a root level (comprising SFQ splitter circuit 1011), an intermediate level (comprising SFQ splitter circuits 1012 and 1013), and a leaf level (comprising SFQ splitter circuits 1014, 1015, 1016, and 1017), to enable fanout of an input SFQ pulse to eight (8) Josephson junctions 1021, 1022, 1023, 1024, 1025, 1026, 1027, and 1028. In this regard, an N-level binary SFQ splitter tree enables fanout to $2^N$ Josephson junctions. In other embodiments, one or more additional levels can be added to the first and second SFQ splitter trees 1010-1 and 1010-2 to enable fanout of input SFQ pulses to more Josephson junctions and thereby enable equal sharing of current loading and current sinking among more Josephson junctions in the first and second Josephson junction stages 1020-1 and 1020-2, which may be desirable for a magnetic flux bias control system that is configured to generate relatively high flux bias currents (e.g., order of milliamps) for a given application. For example, a 4-level binary SFQ splitter tree would enable fanout to sixteen (16) Josephson junctions. This would allow the first and second Josephson junction stages 1020-1 and 1020-2 to source and sink higher magnitude circulating flux bias currents by utilizing a larger number of relatively small size Josephson junctions.

It is to be noted that the first and second balanced tree circuit structures 1030-1 and 1030-2 in FIG. 10 perform functions that are similar to the first and second FJTL circuits 120-1 and 120-2 shown in, e.g., FIGS. 1A, 3, and 8. In particular, as explained above, the first and second balanced tree circuit structures 1030-1 and 1030-2 are configured to receive SFQ pulses and, in response, generate quantized amounts of flux bias current that are injected into a superconducting storage loop to either increment or decrement the amount of flux bias current circulating in the superconducting storage loop. In other words, the first balanced tree circuit structure 1030-1 operates as a first flux bias current generator circuit that is configured to inject positive flux bias current into the superconducting storage loop, while the second balanced tree circuit structure 1030-2 operates as a second flux bias current generator circuit that is configured to inject negative flux bias current into the superconducting storage loop. In this regard, the first and second balanced tree circuit structures 1030-1 and 1030-2 in FIG. 10 can be implemented in the magnetic flux bias control systems 100, 300, and 800 in place of the first and second FJTL circuits 120-1 and 120-2 as shown in, e.g., FIGS. 1A, 3, and 8.

It is to be noted that each of the Josephson junctions depicted in the illustrative embodiments shown in the drawings comprises a Josephson tunnel junction device that is shunted with a resistor (e.g., damping resistor). In this regard, the term Josephson junction as used herein refers to a resistively shunted Josephson tunnel junction. The shunt resistor targets a specific value to achieve a condition referred to as critical damping (e.g., critical damping of an LC resonance of the Josephson tunnel junction between the capacitance C of the tunnel junction and the inductance L associated with a superconducting current of the tunnel junction), which directly affects the primary time constant of a Josephson junction. For example, if the resistance of the shunt resistor were reduced by 50%, the time constant would double.

More specifically, a Josephson junction is normally implemented as a parallel combination of a Josephson tunnel junction with a critical current $I_C$ and a shunt resistor with resistance $R_S$, wherein the product $I_C \times R_S = V_C$ for optimal circuit operation should not exceed a specific value set by the fabrication process. For a typical process with a critical current density of 10 kA/cm$^2$, the value $V_C$ is about 700 uV, e.g., a Josephson junction with a critical current $I_C$=100 uA would be implemented with a shunt resistor having a resistance of 7 Ohms. For ease of illustration, the shunt resistors of the Josephson junctions are not depicted in the schematic circuit diagrams of the drawings, but are assumed to be included with the Josephson junction symbols (e.g., X symbol) shown in the drawings. It is to be noted that the parameter $V_C$ sets the width of an SFQ pulse, e.g., for $V_C$=700 uV, the SFQ pulse width is about 3 picoseconds. It is acceptable to reduce $V_C$ by using a smaller shunt resistor, which would cause a proportional reduction of the pulse height and an increase of the pulse width, since a pulse has a constant area of one flux quantum.

It is to be appreciated that the exemplary SFQ-based magnetic flux bias control systems as disclosed herein provide various advantages over conventional systems which generate flux bias control signals using control pulse generators based on semiconductor digital-to-analog converters in room temperature environments, as discussed above. For example, the exemplary SFQ-based magnetic flux bias control systems implement superconducting SFQ circuitry to generate magnetic flux bias control systems, wherein such SFQ-based magnetic flux bias control systems operate in cryogenic environments and exhibit very low power dissipation and, thus, can be disposed in close proximity to the given flux-tunable superconducting/quantum circuits.

Advantageously, placing the SFQ-based magnetic flux bias control systems in close proximity to the flux-tunable superconducting/quantum circuits allows for a significant reduction in latency in generating and applying flux control signals to the flux-tunable superconducting/quantum circuits, and eliminates the need to implement a large number of control input/output (I/O) lines from a room temperature system to a deep cryogenic temperature stage of the dilution refrigerator, where a relatively large and increasing number of I/O control lines would be impractical for, e.g., a large-scale quantum computer. Moreover, placing the SFQ-based magnetic flux bias control systems in close proximity to the flux-tunable superconducting/quantum circuits eliminates the need to transmit the flux bias control signals over relatively long control signal paths and thus eliminates the need to apply pre-compensation pulse shaping techniques to compensate for dispersion and distortion.

Another advantage associated with the exemplary SFQ-based magnetic flux bias control systems is that the SFQ circuitry is inherently quantum mechanically precise. This allows the SFQ-based magnetic flux bias control systems to generate and utilize SFQ pulses with precise amplitudes, along with quantizing superconducting inductors, to control the generation of static and dynamic flux bias with high precision.

Figure 11:
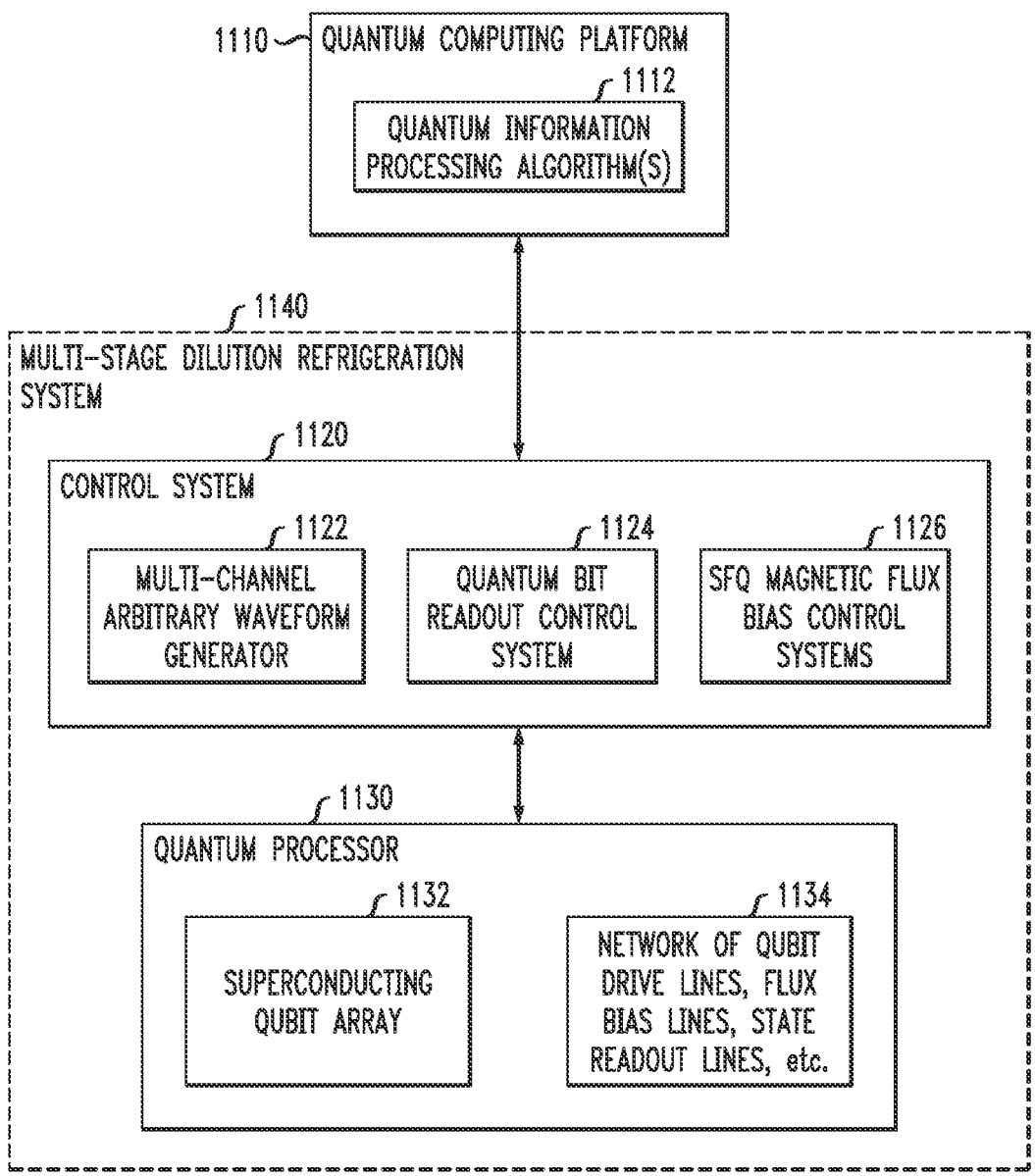
FIG. 11 schematically illustrates a quantum computing system, according to another exemplary embodiment of the disclosure.

As noted above, the SFQ magnetic flux bias control systems discussed herein can be implemented in a quantum computing system to control the flux biasing of quantum circuits and/or individual quantum components such as superconducting qubits. For example, FIG. 11 schematically illustrates a quantum computing system which implements SFQ magnetic flux bias control systems, according to an exemplary embodiment of the disclosure. In particular, FIG. 11 schematically illustrates a quantum computing system 1100 which comprises a quantum computing platform 1110, a control system 1120, and a quantum processor 1130. In some embodiments, the quantum computing platform 1110 implements software control programs such as quantum information processing algorithms that are executed using the quantum processor 1130 to perform quantum computations and other related operations using control signals that are generated by the control system 1120.

In some embodiments, the control system 1120 comprises a multi-channel arbitrary waveform generator 1122, a quantum bit readout control system 1124, and one or more SFQ magnetic flux bias control systems 1126. The quantum processor 1130 comprises one or more quantum computing chips having one or more of a superconducting qubit array 1132 and a network 1134 of qubit drive lines, flux bias lines, and qubit state readout lines, and other circuit QED components that may be needed for a given application or quantum system configuration. In some embodiments, two or more superconducting qubit arrays can reside on a same quantum processor chip, while in other embodiments, each superconducting qubit array resides on a separate quantum processor chip, wherein multiple quantum processor chips can be vertically stacked and coupled together, via indium bump bonds, using known structures and fabrication techniques. The superconducting qubits of the superconducting qubit array 1132 comprise any type of superconducting qubits including, but not limited to, superconducting transmon qubits, fluxonium qubits, superconducting multimode qubits (e.g., superconducting tunable coupler qubits), etc.

In some embodiments, the control system 1120 (or portions thereof) and the quantum processor 1130 are disposed in a dilution refrigeration system 1140 which can generate cryogenic temperature environments that are sufficient to operate superconducting components of the control system 1120 and quantum processor 1130 for quantum computing applications. For example, the quantum processor 1130 can be cooled down to near-absolute zero, e.g., 10-15 millikelvin (mK), to allow the superconducting qubits and qubit couplers to exhibit quantum behaviors. In some embodiments, the dilution refrigeration system 1140 comprises a multi-stage dilution refrigerator where certain components of the control system 1120 can be maintained at different cryogenic temperatures, as needed. For example, while the quantum processor 1130 and SFQ magnetic flux bias control systems 1126 may need to be cooled down to, e.g., 10-15 mK, other circuit components of the control system 1120 may be operated at cryogenic temperatures greater than 10-15 mK (e.g., cryogenic temperatures in a range of 3K-4K), depending on the configuration of the quantum computing system. Moreover, while FIG. 11 illustrates an exemplary embodiment where the control system 1120 is disposed in the multi-stage dilution refrigeration system 1140, certain components of the control system 1120 can be disposed in a room temperature environment. For example, in some embodiments, the multi-channel arbitrary waveform generator 1122 can be configured to operate in a room temperature environment, wherein the signal outputs of the multi-channel arbitrary waveform generator 1122 are transmitted along RF signal paths (e.g., transmission lines, with isolators, attenuators, QLAs, etc.) to the qubits and other circuit components of the quantum processor 1130.

In some embodiments, the superconducting qubit array 1132 comprises an array of superconducting qubits and superconducting qubit couplers, wherein at least some of the superconducting qubits and/or superconducting qubit couplers have flux-tunable architectures which can be flux biased, as needed, by operation of the SFQ magnetic flux bias control systems 1126, using techniques as discussed above. The network 1134 of qubit drive lines, flux bias lines, coupler drive lines, and qubit state readout lines, etc., are configured to apply control signals to superconducting qubits and coupler circuitry in the superconducting qubit array 1132 to perform various types of gate operations, e.g., single-gate operations, entanglement gate operations, etc., as well as read the quantum states of the superconducting qubits. The network 1134 of qubit drive lines, flux bias lines, coupler drive lines, and qubit state readout lines, etc., is coupled to the control system 1120 through a suitable hardware input/output (I/O) interface, which couples I/O signals between the control system 1120 and the quantum processor 1130. For example, the hardware I/O interface may comprise various types of hardware and components, such as RF cables, wiring, RF elements, optical fibers, heat exchangers, filters, attenuators, quantum limited amplifiers, isolators, etc.

The multi-channel arbitrary waveform generator 1122 comprises a plurality of AWG channels that are configured to generate RF control pulses that are applied on the qubit drive lines to control respective ones of the superconducting qubits and qubit couplers of the superconducting qubit array 1132 of the quantum processor 1130. In some embodiments, each AWG channel comprises a respective control pulse envelope generator to generate a digital control pulse envelope, a digital-to-analog converter to convert the digital control pulse envelope to an analog control pulse envelope (quadrature analog I/Q control pulses), a filter to low pass filter the analog control pulses (e.g., to pass the fundamental spectral components of respective analog I/Q signals, while suppressing the image components of the respective analog I/Q signals), an I/Q mixer to mix the analog I/Q control pulses with quadrature local oscillator (LO) and perform single sideband modulation (SSB) to generate an RF control pulse, an amplifier/attenuator to amplify or attenuate the RF control pulse, a LO signal generator, and an LO signal output driver to drive the I/Q mixer.

The control pulse envelope generator is configured to implement pulse-shaping techniques to generate RF control pulses with desired control pulse envelope shapes (e.g., Gaussian pulses, cosine pulses (e.g., sum of half cosines), hyperbolic secant pulses, etc.), which are applied to superconducting qubits or active qubit coupler circuits to perform single qubit gate operations, entanglement gate operations, etc. The shaped control pulses are calibrated to drive $f_{01}$ transitions of the qubits, while suppressing $f_{12}$ and higher transitions. Essentially, such pulse shaping techniques suppress/reduce the transients associated with turning the control pulses on and off. In addition, pulse-shaping techniques include DRAG (derivative removal by adiabatic gate) correction pulses, which can be used in conjunction with shaped pulses (such as Gaussian pulses, cosine pulses, or hyperbolic secant pulses) to further suppress unwanted state transitions, while maintaining a same pulse envelope area (or integral of pulse envelope).

The quantum bit readout control system 1124 is coupled to state readout lines (e.g., readout resonators) on the quantum processor 1130. The state readout lines are coupled to respective ones of the superconducting qubits in the superconducting qubit array 1132 to read the states of the superconducting qubits using known techniques (e.g., dispersive readout). For example, in some embodiments, a dispersive readout operation for reading the quantum state of a given superconducting qubit which is coupled to a given readout resonator, is performed by applying an input readout signal (e.g., microwave pulse) to the given readout resonator, and detecting/processing the readout signal that is reflected out from the given readout resonator. For example, in some embodiments, the readout signal that is applied to the given readout resonator comprises a single frequency tone that is the same or similar to the resonant frequency of the readout resonator, a pulse envelope with a given pulse shape (e.g., gaussian pulse envelope), and a given pulse duration. In the dispersive regime of qubit-resonator coupling, the input readout signal interacts with the given qubit/resonator system, and the resulting output readout signal which is reflected out from the given readout resonator comprises information (e.g., phase and/or amplitude) that is qubit-state dependent. For example, in some embodiments, the quantum state of the given qubit is determined by measuring a state-dependent phase shift of the reflected output readout signal.

In some embodiments, the quantum bit readout control system 1124 implements a frequency-multiplexed readout system, which is configured to read out (e.g., concurrently) the quantum states of multiple superconducting qubits and combine multiple qubit readout signals of the superconducting qubits into a single output line (or readout chain) to achieve an increased spectral density of qubit readout signals on the single output line. A given readout chain may include components such as readout resonators, isolators, QLAs, and HEMT amplifiers (which are disposed in different temperature stages, e.g., five temperature stages: 20 mK, 100 mK, 1K, 3-4K, 40, of the dilution refrigeration system 1140), and downconverter and analog-to-digital circuitry (which are disposed in a room temperature environment outside the dilution refrigeration system) to extract and generate digital readout signals for processing by the quantum computing platform 1110.

In embodiments where the superconducting qubit array 1132 comprises flux-tunable superconducting components such as flux-tunable superconducting qubits and flux-tunable qubit coupler circuits, the flux-tunable superconducting components would be coupled to the SFQ magnetic flux bias control systems 1126 via flux bias control lines having superconducting inductors to magnetically couple flux biasing control signals (generated by the SFQ magnetic flux bias control systems 1126) the flux-tunable superconducting components using techniques as discussed above. Moreover, the SFQ magnetic flux bias control systems 1126 are utilized to control flux biasing of flux-tunable quantum circuits (e.g., flux-tunable QLAs) that are implemented by the control system 1120.

The quantum computing platform 1110 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1110 comprises a hardware architecture of processors, memory, etc., which is configured to control the execution of quantum applications, and interface with the control system 1120 to (i) generate digital control signals that are converted to analog microwave control signals by the control system 1120, to control operations of the quantum processor 1130 when executing a given quantum application, and (ii) to obtain and process digital signals received from the control system 1120, which represent the processing results generated by the quantum processor 1130 when executing various gate operations for a given quantum application. In some exemplary embodiments, the quantum computing platform 1110 of the quantum computing system 1100 may be implemented using any suitable computing system architecture (e.g., as shown in FIG. 12) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 12:
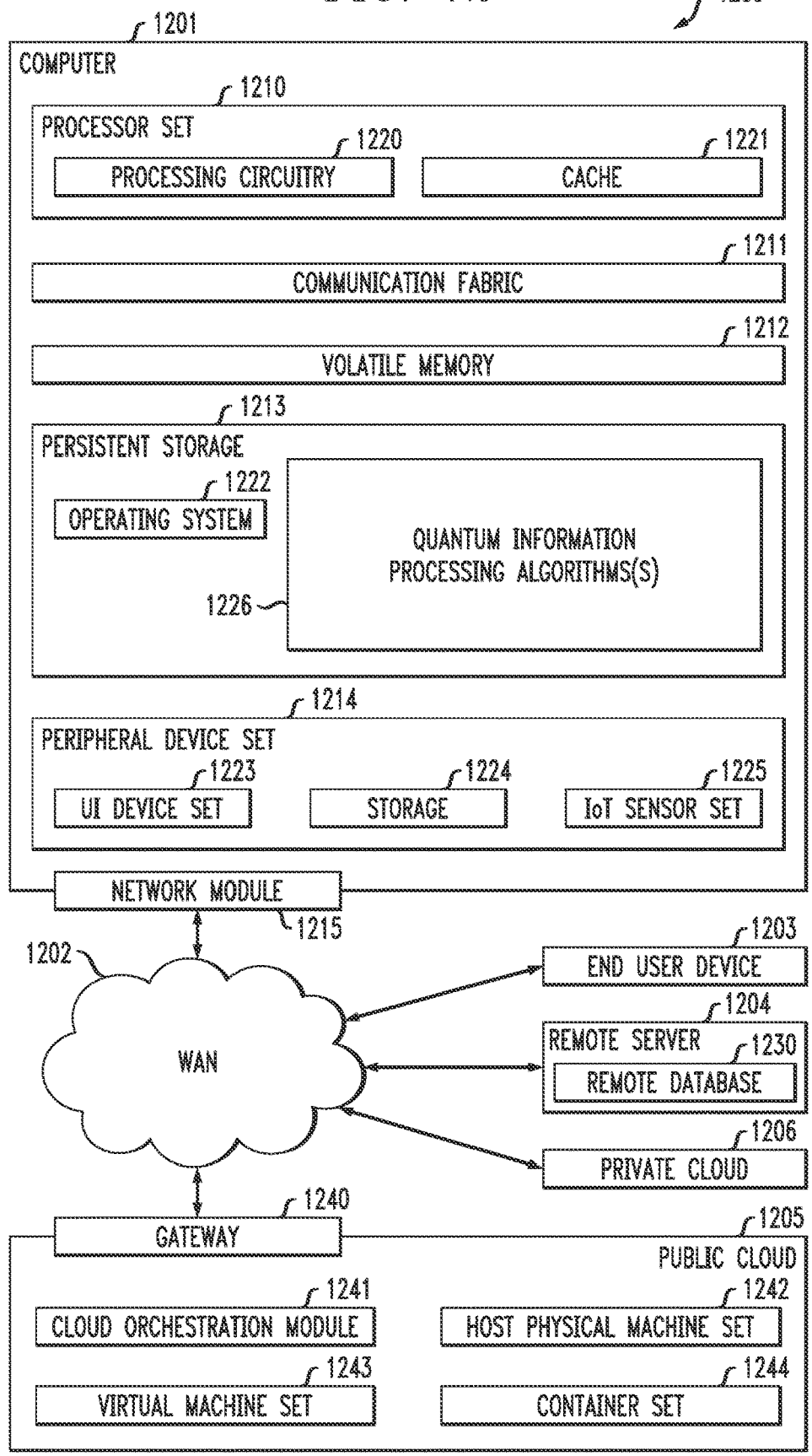
FIG. 12 schematically illustrates an exemplary architecture of a computing environment for hosting a superconducting computing platform, according to an exemplary embodiment of the disclosure.

Computing environment 1200 of FIG. 12 contains an example of an environment for the execution of at least some of the computer code, such computing code in block 1226 for implementing quantum information processing algorithms which are executable by the processing circuitry 1220 to implement high performance superconducting computing operations or superconducting quantum computing using superconducting SFQ-based magnetic flux control systems and quantum processors/quantum computing circuitry, as discussed herein. In addition to block 1226, computing environment 1200 includes, for example, computer 1201, wide area network (WAN) 1202, end user device (EUD) 1203, remote server 1204, public cloud 1205, and private cloud 1206. In this embodiment, computer 1201 includes processor set 1210 (including processing circuitry 1220 and cache 1221), communication fabric 1211, volatile memory 1212, persistent storage 1213 (including operating system 1222 and block 1226, as identified above), peripheral device set 1214 (including user interface (UI), device set 1223, storage 1224, and Internet of Things (IoT) sensor set 1225), and network module 1215. Remote server 1204 includes remote database 1230. Public cloud 1205 includes gateway 1240, cloud orchestration module 1241, host physical machine set 1242, virtual machine set 1243, and container set 1244.

Computer 1201 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1230. As is well understood in the art of computer technology, and depending upon the technology, performance of a computer-implemented method may be distributed among multiple computers and/or between multiple locations. On the other hand, in this presentation of computing environment 1200, detailed discussion is focused on a single computer, specifically computer 1201, to keep the presentation as simple as possible. Computer 1201 may be located in a cloud, even though it is not shown in a cloud in FIG. 12. On the other hand, computer 1201 is not required to be in a cloud except to any extent as may be affirmatively indicated.

Processor set 1210 includes one, or more, computer processors of any type now known or to be developed in the future. Processing circuitry 1220 may be distributed over multiple packages, for example, multiple, coordinated integrated circuit chips. Processing circuitry 1220 may implement multiple processor threads and/or multiple processor cores. Cache 1221 is memory that is located in the processor chip package(s) and is typically used for data or code that should be available for rapid access by the threads or cores running on processor set 1210. Cache memories are typically organized into multiple levels depending upon relative proximity to the processing circuitry. Alternatively, some, or all, of the cache for the processor set may be located "off chip." In some computing environments, processor set 1210 may be designed for working with qubits and performing quantum computing.

Computer readable program instructions are typically loaded onto computer 1201 to cause a series of operational steps to be performed by processor set 1210 of computer 1201 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1221 and the other storage media discussed below. The program instructions, and associated data, are accessed by processor set 1210 to control and direct performance of the inventive methods. In computing environment 1200, at least some of the instructions for performing the inventive methods may be stored in block 1226 in persistent storage 1213.

Communication fabric 1211 is the signal conduction paths that allow the various components of computer 1201 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1212 is any type of volatile memory now known or to be developed in the future. Examples include dynamic type random access memory (RAM) or static type RAM. Typically, the volatile memory is characterized by random access, but this is not required unless affirmatively indicated. In computer 1201, the volatile memory 1212 is located in a single package and is internal to computer 1201, but, alternatively or additionally, the volatile memory may be distributed over multiple packages and/or located externally with respect to computer 1201.

Persistent storage 1213 is any form of non-volatile storage for computers that is now known or to be developed in the future. The non-volatility of this storage means that the stored data is maintained regardless of whether power is being supplied to computer 1201 and/or directly to persistent storage 1213. Persistent storage 1213 may be a read only memory (ROM), but typically at least a portion of the persistent storage allows writing of data, deletion of data and re-writing of data. Some familiar forms of persistent storage include magnetic disks and solid-state storage devices. Operating system 1222 may take several forms, such as various known proprietary operating systems or open source Portable Operating System Interface type operating systems that employ a kernel. The code included in block 1226 typically includes at least some of the computer code involved in performing the inventive methods.

Peripheral device set 1214 includes the set of peripheral devices of computer 1201. Data communication connections between the peripheral devices and the other components of computer 1201 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1223 may include components such as a display screen, speaker, microphone, wearable devices (such as goggles and smart watches), keyboard, mouse, printer, touchpad, game controllers, and haptic devices. Storage 1224 is external storage, such as an external hard drive, or insertable storage, such as an SD card. Storage 1224 may be persistent and/or volatile. In some embodiments, storage 1224 may take the form of a quantum computing storage device for storing data in the form of qubits. In embodiments where computer 1201 is required to have a large amount of storage (for example, where computer 1201 locally stores and manages a large database) then this storage may be provided by peripheral storage devices designed for storing very large amounts of data, such as a storage area network (SAN) that is shared by multiple, geographically distributed computers. IoT sensor set 1225 is made up of sensors that can be used in Internet of Things applications. For example, one sensor may be a thermometer and another sensor may be a motion detector.

Network module 1215 is the collection of computer software, hardware, and firmware that allows computer 1201 to communicate with other computers through WAN 1202. Network module 1215 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1215 are performed on the same physical hardware device. In other embodiments (for example, embodiments that utilize software-defined networking (SDN)), the control functions and the forwarding functions of network module 1215 are performed on physically separate devices, such that the control functions manage several different network hardware devices. Computer readable program instructions for performing the inventive methods can typically be downloaded to computer 1201 from an external computer or external storage device through a network adapter card or network interface included in network module 1215.

WAN 1202 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1203 is any computer system that is used and controlled by an end user (for example, a customer of an enterprise that operates computer 1201), and may take any of the forms discussed above in connection with computer 1201. EUD 1203 typically receives helpful and useful data from the operations of computer 1201. For example, in a hypothetical case where computer 1201 is designed to provide a recommendation to an end user, this recommendation would typically be communicated from network module 1215 of computer 1201 through WAN 1202 to EUD 1203. In this way, EUD 1203 can display, or otherwise present, the recommendation to an end user. In some embodiments, EUD 1203 may be a client device, such as thin client, heavy client, mainframe computer, desktop computer and so on.

Remote server 1204 is any computer system that serves at least some data and/or functionality to computer 1201. Remote server 1204 may be controlled and used by the same entity that operates computer 1201. Remote server 1204 represents the machine(s) that collect and store helpful and useful data for use by other computers, such as computer 1201. For example, in a hypothetical case where computer 1201 is designed and programmed to provide a recommendation based on historical data, then this historical data may be provided to computer 1201 from remote database 1230 of remote server 1204.

Public cloud 1205 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1205 is performed by the computer hardware and/or software of cloud orchestration module 1241. The computing resources provided by public cloud 1205 are typically implemented by virtual computing environments that run on various computers making up the computers of host physical machine set 1242, which is the universe of physical computers in and/or available to public cloud 1205. The virtual computing environments (VCEs) typically take the form of virtual machines from virtual machine set 1243 and/or containers from container set 1244. It is understood that these VCEs may be stored as images and may be transferred among and between the various physical machine hosts, either as images or after instantiation of the VCE. Cloud orchestration module 1241 manages the transfer and storage of images, deploys new instantiations of VCEs and manages active instantiations of VCE deployments. Gateway 1240 is the collection of computer software, hardware, and firmware that allows public cloud 1205 to communicate through WAN 1202.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1206 is similar to public cloud 1205, except that the computing resources are only available for use by a single enterprise. While private cloud 1206 is depicted as being in communication with WAN 1202, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1205 and private cloud 1206 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a superconducting inductor comprising a quantizing inductance; and
   superconducting control circuitry which is coupled to the superconducting inductor to form a superconducting loop, and which is configured to selectively inject a quantized amount of positive current or negative current into the superconducting loop to generate a quantized circulating current in the superconducting loop, wherein the quantized circulating current comprises one of a time-varying circulating current and a static circulating current;
   wherein the superconducting control circuitry comprises:
      a first current generator circuit comprising a first plurality of Josephson junctions and a first current distribution network, wherein the first plurality of Josephson junctions are configured to inject a quantized amount of positive current into the superconducting loop in response to each single flux quantum pulse applied to the first current generator circuit; and a second current generator circuit comprising a second plurality of Josephson junctions and a second current distribution network, wherein the second plurality of Josephson junctions are configured to inject a quantized amount of negative current into the superconducting loop in response to each single flux quantum pulse applied to the second current generator circuit;

wherein the first current distribution network is configured to distribute a quantized circulating negative current in the superconducting loop to the first plurality of Josephson junctions to sink the quantized circulating negative current to a ground node through the first plurality of Josephson junctions without causing a switching of any of the first plurality of Josephson junctions; and wherein the second current distribution network is configured to distribute a quantized circulating positive current in the superconducting loop to the second plurality of Josephson junctions to sink the quantized circulating positive current to the ground node through the second plurality of Josephson junctions without causing a switching of any of the second plurality of Josephson junctions.

2. The system of claim 1, wherein:

the first current generator circuit comprises a first feeding Josephson transmission line circuit coupled to a first terminal of the superconducting inductor, wherein the first feeding Josephson transmission line circuit comprises a first Josephson transmission line comprising the first plurality of Josephson junctions, and wherein the first current distribution network is coupled to and between the first Josephson transmission line and the first terminal of the superconducting inductor; and the second current generator circuit comprises a second feeding Josephson transmission line circuit coupled to a second terminal of the superconducting inductor, wherein the second feeding Josephson transmission line circuit comprises a second Josephson transmission line comprising the second plurality of Josephson junctions, and wherein the second current distribution network is coupled to and between the second Josephson transmission line and the second terminal of the superconducting inductor.

3. The system of claim 2, wherein the first feeding Josephson transmission line circuit, the second feeding Josephson transmission line circuit, and the superconducting inductor collectively form the superconducting loop.

4. The system of claim 2, wherein the first Josephson transmission line and the second Josephson transmission line are non-amplifying Josephson transmission lines.

5. The system of claim 2, wherein:

the first current distribution network comprises a first balanced inductor H-tree circuit; and the second current distribution network comprises a second balanced inductor H-tree circuit.

6. The system of claim 2, further comprising:

a first bias current generator configured to generate a first static bias current; and a second bias current generator configured to generate a second static bias current;

wherein the first current distribution network is coupled to the first bias current generator and configured to distribute the first static bias current to each Josephson junction of the first plurality of Josephson junctions; and wherein the second current distribution network is coupled to the second bias current generator and configured to distribute the second static bias current to each Josephson junction of the second plurality of Josephson junctions.

7. The system of claim 1, wherein:

the first current generator circuit comprises a first balanced tree circuit structure which comprises a first port, a second port, a first single flux quantum splitter tree, and a first Josephson junction stage which comprises the first plurality of Josephson junctions and the first current distribution network;

the second current generator circuit comprises a second balanced tree circuit structure which comprises a first port, a second port, a second single flux quantum splitter tree, and a second Josephson junction stage which comprises the second plurality of Josephson junctions and the second current distribution network;

a first terminal of the superconducting inductor is coupled to the second port of the first balanced tree circuit structure;

a second terminal of the superconducting inductor is coupled to the second port of the second balanced tree circuit structure; and the first Josephson junction stage, the second Josephson junction stage, and the superconducting inductor collectively form the superconducting loop.

8. The system of claim 7, wherein:

the first single flux quantum splitter tree is configured to distribute a single flux quantum pulse, which is applied to the first port of the first balanced tree circuit structure, to each Josephson junction of the first plurality of Josephson junctions of the first Josephson junction stage, and cause each Josephson junction to generate a quantized amount of positive current that is injected into the superconducting loop; and the second single flux quantum splitter tree is configured to distribute a single flux quantum pulse, which is applied to the first port of the second balanced tree circuit structure, to each Josephson junction of the second plurality of Josephson junctions of the second Josephson junction stage, and cause each Josephson junction to generate a quantized amount of negative current that is injected into the superconducting loop.

9. The system of claim 8, wherein the Josephson junctions of the first plurality of Josephson junctions and the second plurality of Josephson junctions have a same critical current.

10. The system of claim 1, wherein the superconducting control circuitry further comprises:

a pulse generator circuit configured to generate successive single flux quantum pulses in response to an oscillating control signal which drives the pulse generator circuit; and a switch circuit configured to selectively apply one or more successive single flux quantum pulses to one of: an input port of the first current generator circuit to cause the first current generator circuit to inject a quantized amount of positive current into the superconducting loop; and an input port of the second current generator circuit to cause the second current generator circuit to inject a quantized amount of negative current into the superconducting loop.

11. The system of claim 10, wherein the switch circuit comprises a single flux quantum single pole, double throw switch which comprises an input port to receive the one or more successive single flux quantum pulses, a first output port to selectively output the one or more successive single flux quantum pulses to the input port of the first current generator circuit, a second output port to selectively output the one or more successive single flux quantum pulses to the input port of the second current generator circuit, and a control port configured to receive a control signal to selectively activate one of the first output port and the second output port of the single flux quantum single pole, double throw switch, in response to the control signal.

12. The system of claim 1, wherein the superconducting control circuitry further comprises:
a toggle flip-flop circuit comprising an input port, a first output port, and a second output port;
a first pulse multiplier circuit comprising an input port coupled to the first output port of the toggle flip-flop circuit, and an output port coupled to an input port of the first current generator circuit; and
a second pulse multiplier circuit comprising an input port coupled to the second output port of the toggle flip-flop circuit, and an output port coupled to an input port of the second current generator circuit;
wherein the first pulse multiplier circuit is configured to generate and apply a plurality of single flux quantum pulses to the input port of the first current generator circuit, in response to one single flux quantum pulse output from the first output port of the toggle flip-flop circuit; and
wherein the second pulse multiplier circuit is configured to generate and apply a plurality of single flux quantum pulses to the input port of the second current generator circuit, in response to one single flux quantum pulse output from the second output port of the toggle flip-flop circuit.

13. The system of claim 12, wherein the first pulse multiplier circuit and the second pulse multiplier circuit are one of: non-programmable circuits that are each configured to generate a fixed number of single flux quantum pulses in response to one single flux quantum pulse; and
programmable circuits that are each configured to generate a programmed number of single flux quantum pulses in response to one single flux quantum pulse.

14. A system, comprising:
a quantum processor comprising a quantum circuit; and
a magnetic flux bias control system comprising a superconducting inductor and superconducting control circuitry;
wherein the superconducting inductor comprises a quantizing inductance and is coupled to the quantum circuit;
wherein the superconducting control circuitry is coupled to the superconducting inductor to form a superconducting loop and is configured to selectively inject a quantized amount of positive current or negative current into the superconducting loop to generate a quantized circulating current in the superconducting loop to cause the superconducting inductor to generate a magnetic flux that is coupled to the quantum circuit to flux bias the quantum circuit, wherein the quantized circulating current comprises one of a time-varying circulating current and a static circulating current; and
wherein the superconducting control circuitry comprises:
a first current generator circuit comprising a first plurality of Josephson junctions and a first current distribution network, wherein the first plurality of Josephson junctions are configured to inject a quantized amount of positive current into the superconducting loop in response to each single flux quantum pulse applied to the first current generator circuit; and
a second current generator circuit comprising a second plurality of Josephson junctions and a second current distribution network, wherein the second plurality of Josephson junctions are configured to inject a quantized amount of negative current into the superconducting loop in response to each single flux quantum pulse applied to the second current generator circuit;
wherein the first current distribution network is configured to distribute a quantized circulating negative current in the superconducting loop to the first plurality of Josephson junctions to sink the quantized circulating negative current to a ground node through the first plurality of Josephson junctions without causing a switching of any of the first plurality of Josephson junctions; and
wherein the second current distribution network is configured to distribute a quantized circulating positive current in the superconducting loop to the second plurality of Josephson junctions to sink the quantized circulating positive current to the ground node through the second plurality of Josephson junctions without causing a switching of any of the second plurality of Josephson junctions.

15. The system of claim 14, wherein:
the quantum circuit comprises an array of superconducting quantum bits comprising at least one flux-tunable superconducting quantum bit; and
the magnetic flux bias control system is configured to flux bias the at least one flux-tunable superconducting quantum bit.

16. The system of claim 14, wherein:
the quantum circuit comprises an array of superconducting quantum bits comprising at least one flux-tunable superconducting coupler circuit which couples at least two superconducting quantum bits; and
the magnetic flux bias control system is configured to flux bias the at least one flux-tunable superconducting coupler circuit to control exchange interactions between the at least two superconducting quantum bits.

17. The system of claim 14, wherein:
the first current generator circuit comprises a first feeding Josephson transmission line circuit coupled to a first terminal of the superconducting inductor, wherein the first feeding Josephson transmission line circuit comprises a first Josephson transmission line comprising the first plurality of Josephson junctions, and wherein the first current distribution network is coupled to and between the first Josephson transmission line and the first terminal of the superconducting inductor; and
the second current generator circuit comprises a second feeding Josephson transmission line circuit coupled to a second terminal of the superconducting inductor, wherein the second feeding Josephson transmission line circuit comprises a second Josephson transmission line comprising the second plurality of Josephson junctions, and wherein the second current distribution network is coupled to and between the second Josephson transmission line and the second terminal of the superconducting inductor.

18. The system of claim 17, wherein the superconducting control circuitry further comprises:
a pulse generator circuit configured to generate successive single flux quantum pulses in response to an oscillating control signal which drives the pulse generator circuit; and
a switch circuit configured to selectively apply one or more successive single flux quantum pulses to one of: an input port of the first current generator circuit to cause the first current generator circuit to inject a quantized amount of positive current into the superconducting loop; and an input port of the second current generator circuit to cause the second current generator circuit to inject a quantized amount of negative current into the superconducting loop.

19. A method, comprising:
selectively injecting a quantized amount of positive current or negative current into a superconducting loop, which comprises a first current generator circuit, a second current generator circuit, and a superconducting inductor with a quantizing inductance, to generate a quantized circulating current in the superconducting loop, wherein the quantized circulating current comprises one of a time-varying circulating current and a static circulating current, and wherein selectively injecting the quantized amount of positive current or negative current into the superconducting loop comprises:
applying a single flux quantum pulse to the first current generator circuit to cause a first plurality of Josephson junctions of the first current generator circuit to inject a quantized amount of positive current into the superconducting loop;
applying a single flux quantum pulse to the second current generator circuit to cause a second plurality of Josephson junctions of the second current generator circuit to inject a quantized amount of negative current into the superconducting loop;
distributing a quantized circulating negative current in the superconducting loop to the first plurality of Josephson junctions to sink the quantized circulating negative current to a ground node through the first plurality of Josephson junctions without causing a switching of any of the first plurality of Josephson junctions; and
distributing a quantized circulating positive current in the superconducting loop to the second plurality of Josephson junctions to sink the quantized circulating positive current to the ground node through the second plurality of Josephson junctions without causing a switching of any of the second plurality of Josephson junctions.

20. The method of claim 19, further comprising utilizing the quantized circulating current in the superconducting loop to at least one of (i) generate a quantized magnetic flux bias that is coupled from the superconducting inductor to a device or circuit and (ii) directly bias a device or circuit using the quantized circulating current in the superconducting loop.

* * * * *